United States Patent
King et al.

(10) Patent No.: US 11,043,479 B2
(45) Date of Patent: Jun. 22, 2021

(54) OPTO-COUPLER WITH FIELD-SHAPING END CAPS

(71) Applicant: University of New Hampshire, Durham, NC (US)

(72) Inventors: Brian J. King, Nottingham, NH (US); Mark S. Granoff, Auburn, NH (US); Philip DeMaine, Epping, NH (US)

(73) Assignee: University of New Hampshire, Durham, NH (US)

( * ) Notice: Subject to any disclaimer, the term of this patent is extended or adjusted under 35 U.S.C. 154(b) by 153 days.

(21) Appl. No.: 16/335,367

(22) PCT Filed: Sep. 25, 2017

(86) PCT No.: PCT/US2017/053282
§ 371 (c)(1),
(2) Date: Mar. 21, 2019

(87) PCT Pub. No.: WO2018/058052
PCT Pub. Date: Mar. 29, 2018

(65) Prior Publication Data
US 2019/0221554 A1 Jul. 18, 2019

Related U.S. Application Data

(60) Provisional application No. 62/399,826, filed on Sep. 26, 2016.

(51) Int. Cl.
*H04B 10/80* (2013.01)
*H01L 25/16* (2006.01)
(Continued)

(52) U.S. Cl.
CPC .............. *H01L 25/167* (2013.01); *G01J 1/42* (2013.01); *H01L 25/165* (2013.01);
(Continued)

(58) Field of Classification Search
CPC ............................. H01L 25/167; H04B 10/802
See application file for complete search history.

(56) References Cited

U.S. PATENT DOCUMENTS

| 2004/0035598 A1* | 2/2004 | Whitney ............... H01L 31/167 174/394 |
| 2007/0045800 A1 | 3/2007 | King et al. |

(Continued)

FOREIGN PATENT DOCUMENTS

WO   2018058052 A1   3/2018

OTHER PUBLICATIONS

International Search Report and Written Opinion for International Application PCT/US20171053282, entitled "Opto-Coupler with Field-Shaping End Caps," dated Dec. 28, 2017.

*Primary Examiner* — Thanh Luu
(74) *Attorney, Agent, or Firm* — Hamilton, Brook, Smith & Reynolds, P.C.

(57) ABSTRACT

An opto-coupler includes a housing having end walls configured to have high-voltage (HV) input and output conductors protruding therethrough. The opto-coupler also includes at least one light emitting diode (LED) mounted to the housing and configured to activate the HV diode to pass electrical current by emitting light toward the HV diode. At least one press-fit end cap is configured to provide a press-fit seal either between the HV input conductor and the input end wall or between the HV output conductor and the output end wall. The press-fit end cap is configured to protect the LED from damage by shaping an electric field between the HV input or output conductor and the LED. Embodiments enable compact opto-coupler sizes with high-voltage ratings, such as 8 kV or 15 kV. Electrical current transfer ratios may be much higher than in existing opto-couplers.

19 Claims, 24 Drawing Sheets

(51) Int. Cl.
  *G01J 1/42* (2006.01)
  *H01L 31/0232* (2014.01)
  *H01L 31/167* (2006.01)

(52) U.S. Cl.
  CPC ...... *H01L 31/02327* (2013.01); *H01L 31/167* (2013.01); *H04B 10/802* (2013.01)

(56) References Cited

U.S. PATENT DOCUMENTS

| | | |
|---|---|---|
| 2013/0279842 A1 | 10/2013 | Gary et al. |
| 2014/0042344 A1 | 2/2014 | Maasi et al. |
| 2014/0119691 A1 | 5/2014 | Tay et al. |
| 2017/0194528 A1* | 7/2017 | Niimura ................ H01L 33/483 |

* cited by examiner

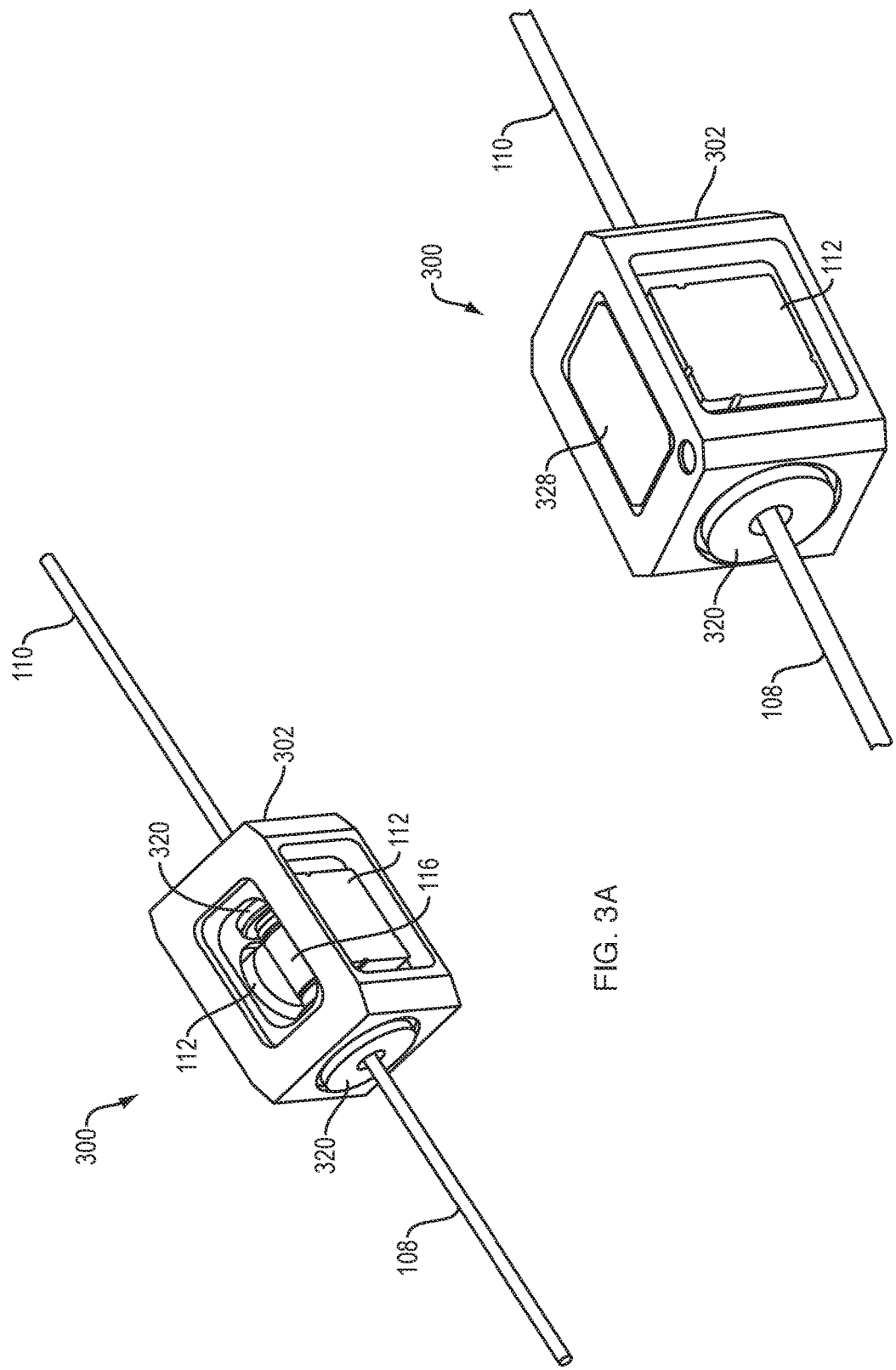

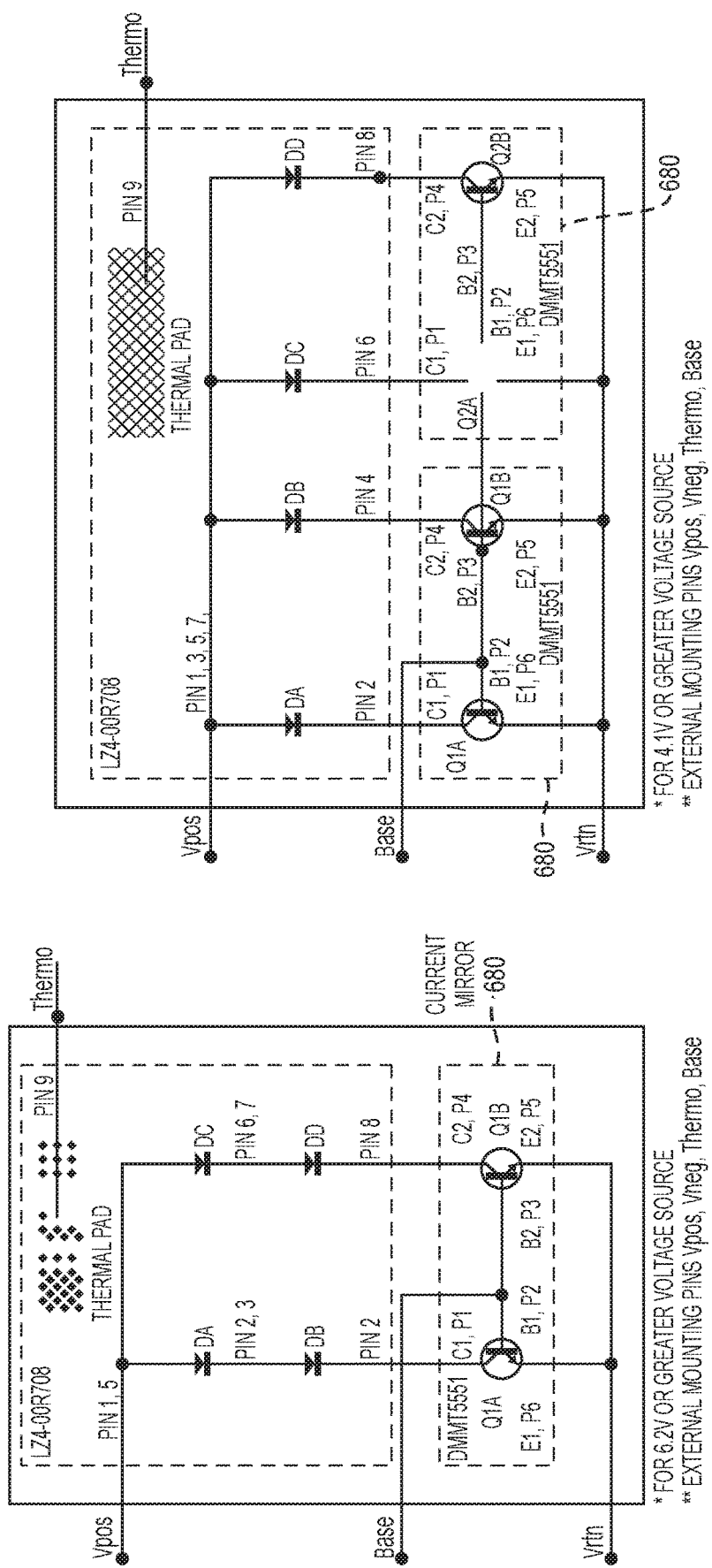
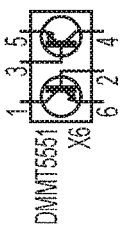
FIG. 6B
FIG. 6A

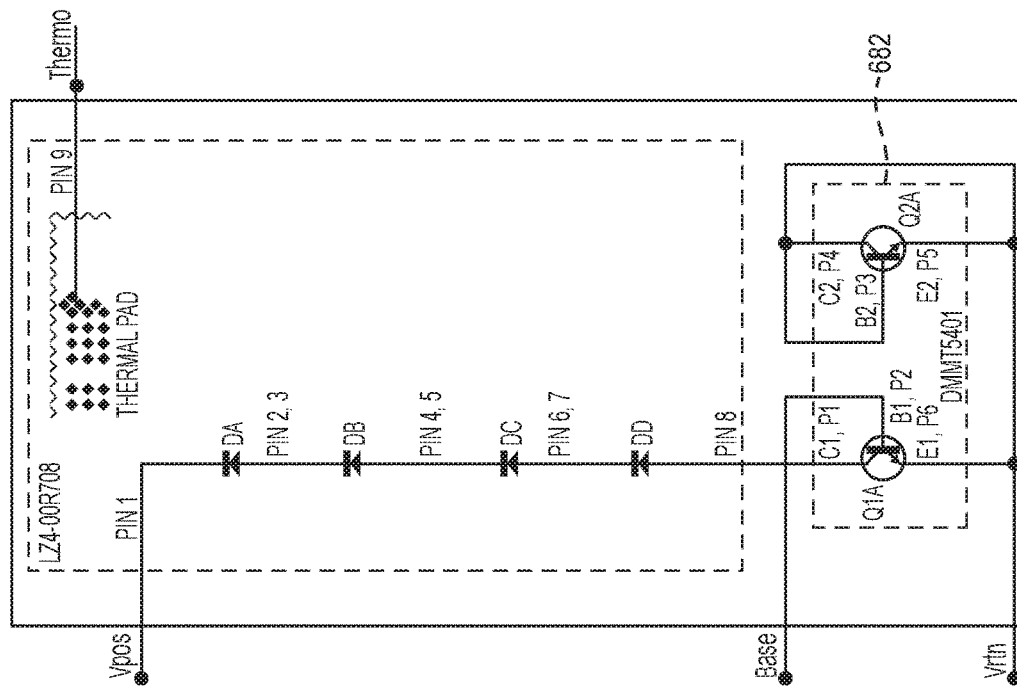

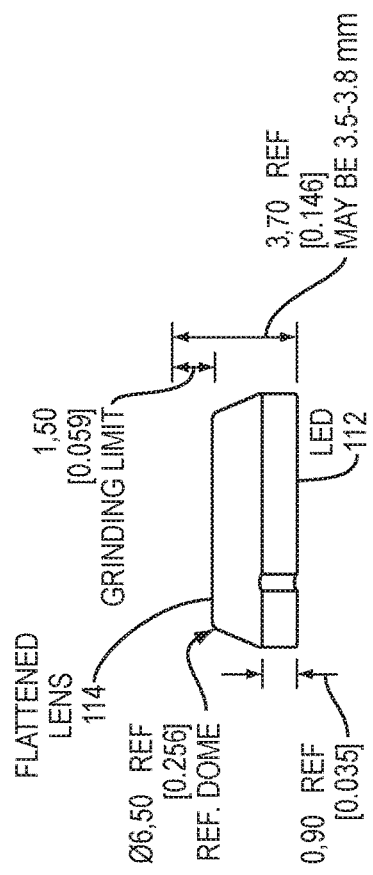
FIG. 8A-2
FIG. 8A-3
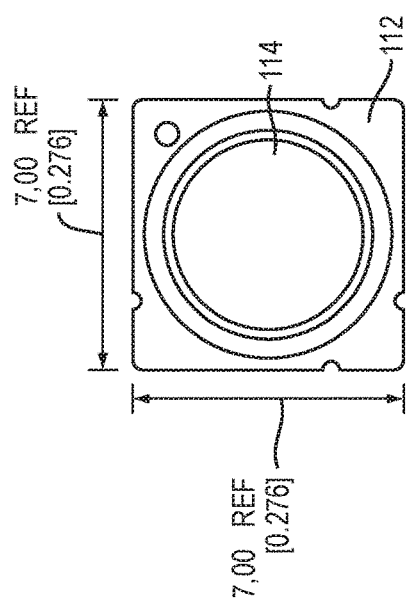
FIG. 8A-1
GRINDING LIMIT FOR LED TESTING AND ENVELOPE STUDY.

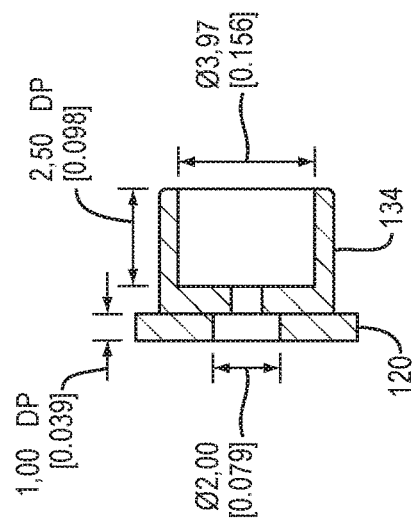
FIG. 8B-3
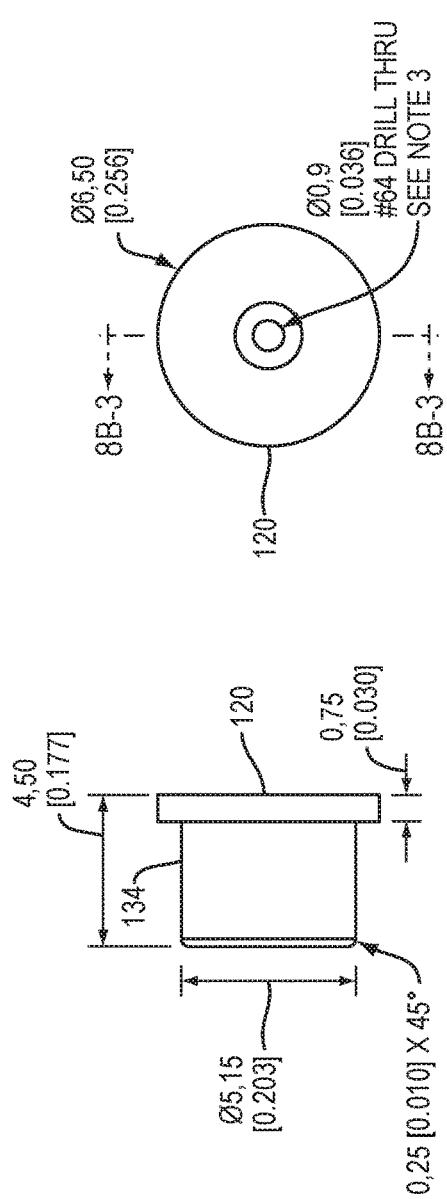
FIG. 8B-2
FIG. 8B-1
FIG. 8B-4
NOTES:
1) REMOVE ALL BURRS AND SHARP EDGES R0.25[0.010].
2) QTY 1 PER OPTO-COUPLER.
3) DRILL HOLE FOR SLIGHT INTERFERENCE FIT WITH VMI RZ464 HV DIODE WITH A #64 DRILL. LEAD SHOULD PASS THRU WITH SOME RESISTANCE FOR A SEALING FIT. ADJUST DRILL SIZE TO SUIT.
4) MEASURE MATING FEATURE ON OPTO-COUPLER HOUSING P/N EMC-B-2195 & ADJUST PLUG DIAMETER FOR A LITE PRESS FIT.

FIG. 8C-1, FIG. 8C-2, FIG. 8C-3, FIG. 8C-4, FIG. 8C-5, FIG. 8C-6, FIG. 8C-7

NOTES:
1) REMOVE ALL BURRS AND SHARP EDGES R0.25 [0.010]
2) MAKE FROM GIGAHERTZ-OPTIK ODM98 SINTERED TEFLON; ALTERNATE MATERIALS: PEEK, ULTEM 1000.
3) ADJUST TOOL DIAMETER TO RESULT IN A LIGHT PRESS FIT WITH ENGIN LED LZ4-00R708 RADIUS.
4) REFER TO UNH STEP FILE FOR MACHINING GEOMETRY.
5) SERIALIZE WITH UNIQUE NUMBERING STARTING WITH 001.
6) POCKET AND CAVITY GEOMETRIES ARE ON PART CENTERS, ALL VIEWS.

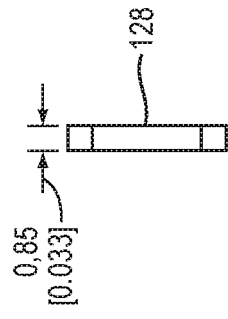
FIG. 8D-2
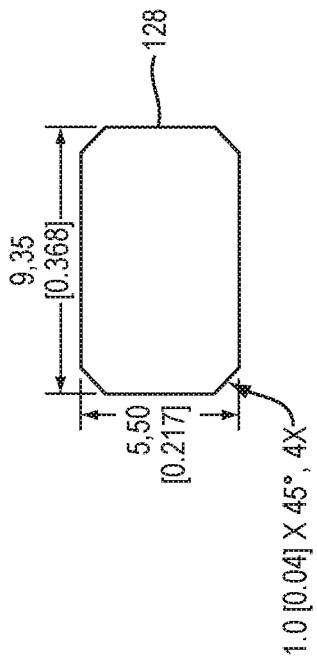
FIG. 8D-1
| UNITS MM/[IN] |
|---|
| TOLERANCES UNLESS OTHERWISE NOTED. ANGLES +/- .25 DEG METRIC MM +/- 0.25mm M.MM +/- 0.1mm ENGLISH XX +/- .01" XXX +/- .004" |
| MACH. FIN. 63 |
| MATERIAL SEE NOTES |
NOTES:
1) REMOVE ALL BURRS AND SHARP EDGES R0.25[0.010].
2) QTY 1 PER OPTO-COUPLER.
3) BASELINE MATERIAL: ODM98; ALTERNATES: PEEK, ULTEM 1000.
FIG. 8D-3

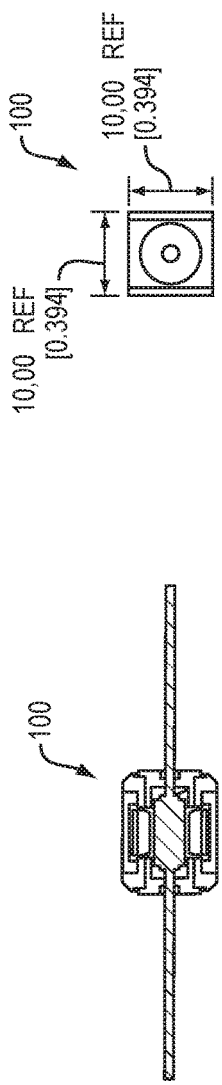
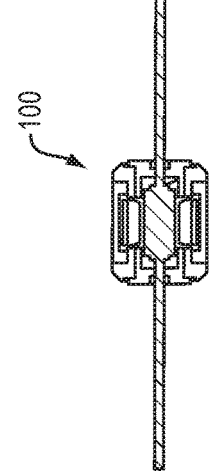
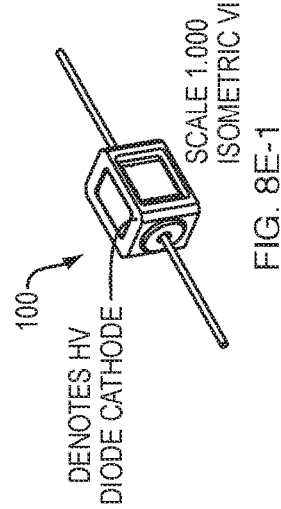
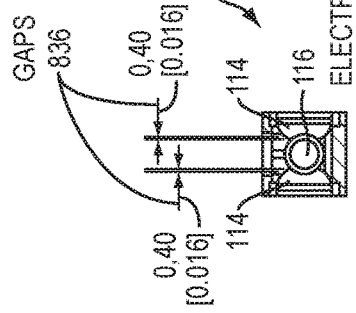
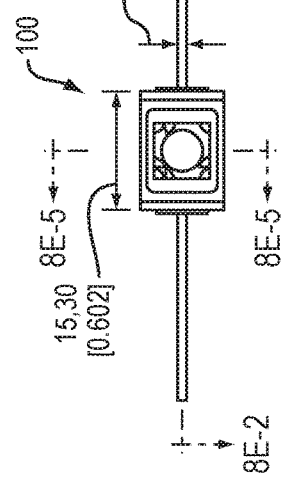

PROCEDURE 1000
FOR MANUFACTURING
AN OPTO-COUPLER

1038 — MOUNT AT LEAST ONE LIGHT-EMITTING DIODE (LED) WITHIN A HOUSING CONFIGURED TO ACCOMODATE A HIGH-VOLTAGE (HV) INPUT CONDUCTOR TO PROTRUDE THROUGH AN INPUT END WALL OF THE HOUSING AND TO ACCOMODATE AN HV OUTPUT CONDUCTOR TO PROTRUDE THROUGH AN OUTPUT END WALL OF THE HOUSING, THE LED CONFIGURED TO ACTIVATE AN HV DIODE SITUATED WITHIN THE HOUSING TO PASS ELECTRICAL CURRENT FROM THE HV INPUT CONDUCTOR TO THE HV OUTPUT CONDUCTOR BY EMITTING LIGHT TOWARD AN ACTIVE PORTION OF THE HV DIODE.

1039 — PRESS-FIT AT LEAST ONE END CAP TO PROVIDE A PRESS-FIT SEAL EITHER BETWEEN THE HV INPUT CONDUCTOR AND THE INPUT END WALL OR BETWEEN THE HV OUTPUT CONDUCTOR AND THE OUTPUT END WALL, THE AT LEAST ONE PRESS-FIT END CAP CONFIGURED TO PROTECT THE AT LEAST ONE LED FROM DAMAGE BY SHAPING AN ELECTRIC FIELD BETWEEN THE HV INPUT OR OUTPUT CONDUCTOR AND THE LED.

FIG. 10

OPTO-COUPLER WITH FIELD-SHAPING END CAPS

RELATED APPLICATION(S)

This application is the U.S. National Stage of International Application No. PCT/US2017/053282, filed on Sep. 25, 2017, which designates the U.S., published in English, and claims the benefit of U.S. Provisional Application No. 62/399,826, filed on Sep. 26, 2016. The entire teachings of the above applications are incorporated herein by reference.

COMMON OWNERSHIP UNDER JOINT RESEARCH AGREEMENT 35 U.S.C. 102(c)

The subject matter disclosed in this application was developed, and the claimed invention was made by, or on behalf of, one or more parties to a joint Research Agreement that was in effect on or before the effective filing date of the claimed invention. The parties to the Joint Research Agreement are as follows: University of New Hampshire and Southwest Research Institute.

BACKGROUND

An optoelectronic coupling element or ("opto-coupler"), also known as an optoisolator or optoelectronic relay, is a semiconductor device used to provide an electrical path between two current-isolated circuits controlled by light transmission. In most instances, a light-emitting diode (LED) emitter in the visible or infrared (IR) wavelength range is optically coupled to a detector such as a diode or a transistor. The emitter converts an electrical signal into a beam of visible or infrared light that can be modulated. The light travels across a transparent gap and produces conduction electrons in the band gap of the detector, which controls the current through the device. Opto-couplers are preferred to mechanical relays because of the lack of moving parts, long life, small size, fast response time, and compatibility with semiconductor circuits. They are highly efficient in high voltage (HV) circuits because the power consumed in an OFF state of the opto-couplers is nearly zero.

SUMMARY

Most opto-couplers isolate low voltages (less than 5,000 volts), wherein an LED emitter is closely spaced to a detector (high-voltage diode, or HV diode) with a clear dielectric material positioned in between the LED and detector. In these designs, transfer efficiency across the HV diode is prioritized over light coupling between the LED and the HV diode. In other instances, where it is desirable to isolate high voltages (10,000 volts or more), the emitter and detector must be carefully constructed to avoid arcing. In these designs, significant light is lost in the process of transmitting light between the LED and the detector (HV diode). Accordingly, a high current transfer ratio (CTR) is difficult with conventional designs. For purposes of this application, CTR is defined as HV output current (through the HV diode), divided by the input current used to drive the LED(s) to activate the HV diode, multiplied by 100%.

Furthermore, because of the high voltages involved and the potential for damage to activating LEDs, existing opto-couplers are limited in how small they can be due to the required clearances between the HV diode and the LEDs in order to prevent damage. As is known, there is a typical 1 kV per millimeter rule for the distance between a high-voltage pin and other parts of a PC board or other low-voltage electronic components in order to prevent damage. Accordingly, there remains a long-felt need for smaller opto-couplers that are configured for high-voltage operation.

Embodiments described herein can overcome the limitations described above and satisfy the long-felt need for reduced size opto-coupler packaging by enabling an opto-coupler to be small, even while operating at high-voltage, such as high as 8 kV or 15 kV, for example. Embodiments can have an additional advantage in that CTR ratios can be dramatically higher than in existing opto-couplers, such as higher by a factor of 10 or 20, for example. In various embodiments, these goals are accomplished by providing press-fit end caps fitted around high-voltage input and output conductors for the opto-coupler. Disclosed end caps may be configured to shape the electric field between the high-voltage conductors and LEDs that activate the HV diode. Furthermore, multiple activating LEDs may be used advantageously to increase device reliability and CTR values. Activating LEDs may include projecting output light through lenses that are shaved to be substantially flat, enabling the LEDs to be placed in closer proximity to the HV diode, increasing light coupling efficiency and CTR values. Even with this closer proximity, damage to the LEDs may be prevented because of the reduced electric field that is caused by shaping the electric field using the press-fit end caps.

In one embodiment, an opto-coupler includes a housing having an input end wall and an output end wall. The input end wall is configured to accommodate an HV input conductor to protrude therethrough, and the output end wall is configured to accommodate an HV output conductor to protrude therethrough. The opto-coupler further includes at least one LED mounted directly or indirectly to the housing. The LED is configured to activate an HV diode situated within the housing to pass electrical current from the HV input conductor to the HV output conductor by emitting light toward an active portion of the HV diode. At least one press-fit end cap is also included in the opto-coupler, and this end cap is configured to provide a press-fit seal either between the HV input conductor and the input end wall or between the HV output conductor and the output end wall. The at least one press-fit end cap is configured to protect the at least one LED from damage by shaping an electric field between the HV input or output conductor and the LEDs.

The at least one press-fit end cap may be a first press-fit end cap configured to provide a press-fit seal between the HV input conductor and the input end wall. The opto-coupler may further include a second press-fit end cap configured to provide a press-fit seal between the HV output conductor and the output end wall. The at least one press-fit end cap may define a cavity around the HV input conductor at a side of the input end wall that is interior or exterior to the housing. As an alternative, or in addition, the at least one press-fit end cap may also define a cavity around the HV output conductor that is interior or exterior to the housing or is a combination thereof.

The at least one press-fit end cap may be further configured to reduce exposure of an optically inactive region of the HV diode to light emitted by the at least one LED and substantially confined emitted light to interact with an active portion of the HV diode. The at least one press-fit end cap can be configured to enable the HV input conductor to be operated continuously at up to 8 kV or 15 kV relative to the LEDs without damaging the LED. This may be done in connection with a potting material held within the housing.

The housing, the at least one press-fit end cap, or both may be formed of a Gigahertz OPTIK® ODM98 sintered Teflon, polyether ether ketone (PEEK), or Ultem™ 1000 material. The housing may include a top or bottom side that is substantially square in shape. The housing may have circuit board layout footprint dimensions of about 13 mm×15 mm.

The at least one LED and the at least one press-fit end cap may be configured to enable the opto-coupler to operate with a current transfer ratio (CTR) between about 0.2 and about 4.0, between about 0.2 and about 3.0, or between about 1.0 and about 3.0.

The at least one LED mounted to the housing in may include two to four LEDs, 4 to 8 LEDs, or 8 to 64 LEDs mounted directly or indirectly to the housing. The LEDs may be configured to provide operational redundancy in case of a failure of one or more of the LEDs. The at least one LED may include a substantially flat lens configured to be situated in a path of the light emitted from the LED toward the active portion of the HV diode. The at least one LED may be further mounted to form a gap in a range of about 0.2 mm to about 0.5 mm between a lens of the at least one LED and the active portion of the HV diode. The at least one LED can include two or more LEDs configured to be driven electrically in parallel with mirrored current.

In another embodiment, a method of manufacturing an opto-coupler includes mounting at least one light-emitting diode (LED) within the housing configured to accommodate a high-voltage (HV) input conductor to protrude through an input end wall of the housing and to accommodate an HV output conductor to protrude through an output end wall of the housing. The LED is configured to activate an HV diode situated within the housing to pass electrical current from the HV input conductor to the HV output conductor by emitting light toward an active portion of the HV diode. The method further includes press-fitting at least one end cap to provide a press-fit seal either between the HV input conductor and the input end wall or between the HV output conductor and the output end wall. The at least one press-fit end cap is configured to protect the at least one LED from damage by shaping an electric field between the HV input or output conductor and the LED.

The method may further include preprocessing a lens of the at least one LED to have a substantially flat lens surface configured to be situated in a path of the light emitted from the LED toward the active portion of the HV diode.

In still another embodiment, an opto-coupler includes means for providing electric field isolation for at least one light-emitting diode (LED) to prevent arc discharge damage within an arc discharge radius of a high-voltage (HV) diode. The opto-coupler further includes means for containing the at least one LED and the HV diode within a closed environment and within operational proximity to each other within the closed environment.

In yet a further embodiment, an opto-coupler includes means for activating a high-voltage (HV) diode to pass electrical current from the HV input conductor to an HV output conductor by emitting light toward an active portion of the HV diode. The opto-coupler also includes means for protecting the means for activating the HV diode from damage by shaping an electric field between the HV input or output conductor and the means for activating the HV diode.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 3A is perspective-view illustration of an alternative embodiment opto-coupler, without a top cover, but with a press-fit end cap having electric field-shaping functions similar to those of the end caps in FIGS. 1A-1B.

FIG. 3B is a perspective-view illustration of the opto-coupler in FIG. 3A including a top housing cover.

FIGS. 6A-6D are schematic diagrams illustrating an electrical configuration corresponding to the opto-coupler of FIGS. 1A-1B, with the HV diode having an NPN configuration.

FIGS. 7A-7C are schematic diagrams showing an electrical configuration for the embodiment opto-coupler illustrated in FIGS. 1A-1B, with the HV diode having a PNP configuration.

FIGS. 8A-1 to 8A-3 are a series of illustrations and specifications for the LED with flattened lens illustrated in the opto-coupler of FIGS. 1A-1B.

FIGS. 8B-1 to 8B-4 are a series of illustrations and engineering tolerances for the press-fit end caps 120 in the opto-coupler 100 in FIGS. 1A-1B.

FIGS. 8C-1 to 8C-7 are various illustrations and specifications for the housing of the opto-coupler illustrated in FIGS. 1A-1B.

FIGS. 8D-1 to 8D-3 are illustrations and specifications for a top cover of the opto-coupler housing illustrated in FIGS. 1A-1B.

FIGS. 8E-1 to 8E-6 are various illustrations and specifications for the whole opto-coupler illustrated in FIGS. 1A-1B.

FIG. 10 is a flow diagram illustrating a procedure for manufacturing embodiment opto-couplers.

DETAILED DESCRIPTION

A description of example embodiments follows.

Figure 1A:
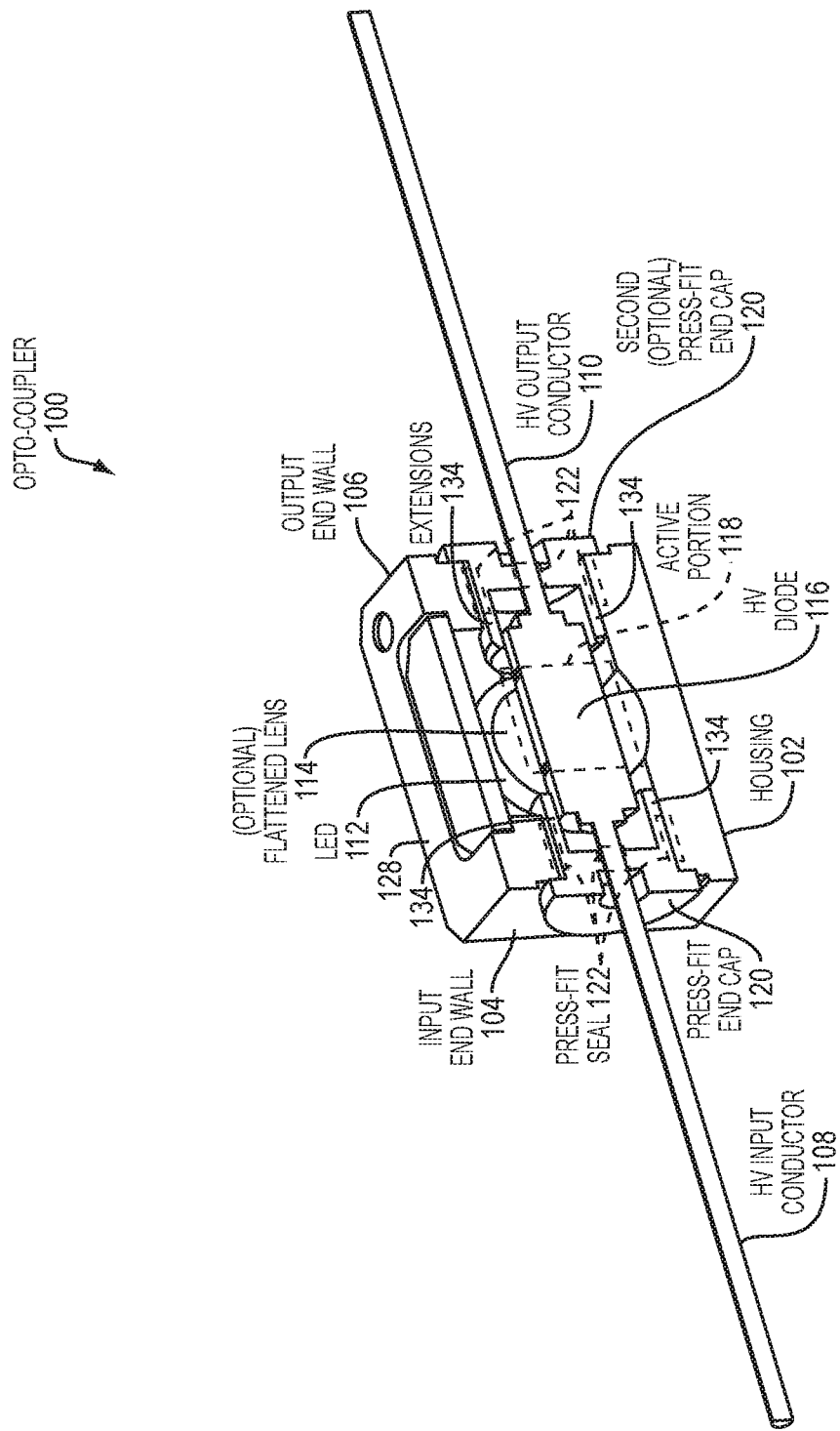
FIG. 1A is a perspective, cross-sectional illustration of an embodiment opto-coupler having press-fit end caps that shape an electric field between a high-voltage (HV) diode and light-emitting diodes (LEDs) configured to activate the HV diode.

FIG. 1A is a perspective, cross-sectional illustration of the opto-coupler 100. The opto-coupler 100 includes a housing 102 having an input end wall 104 and an output end wall 106, as well as a top housing cover 128. The input end wall is configured to accommodate a high-voltage (HV) input conductor 108 to protrude through the input end wall 104. The output end wall 106 is configured to accommodate a corresponding HV output conductor 110 to protrude therethrough. The HV input and output conductors 108 and 110 are electrically coupled to respective sides of an HV diode 116, which is held within the housing 102. The housing 102, therefore, provides one means for containing the HV diode and LEDs or portions such as lenses thereof within a closed environment and within operational proximity to each other within the closed environment.

Figure 1B:
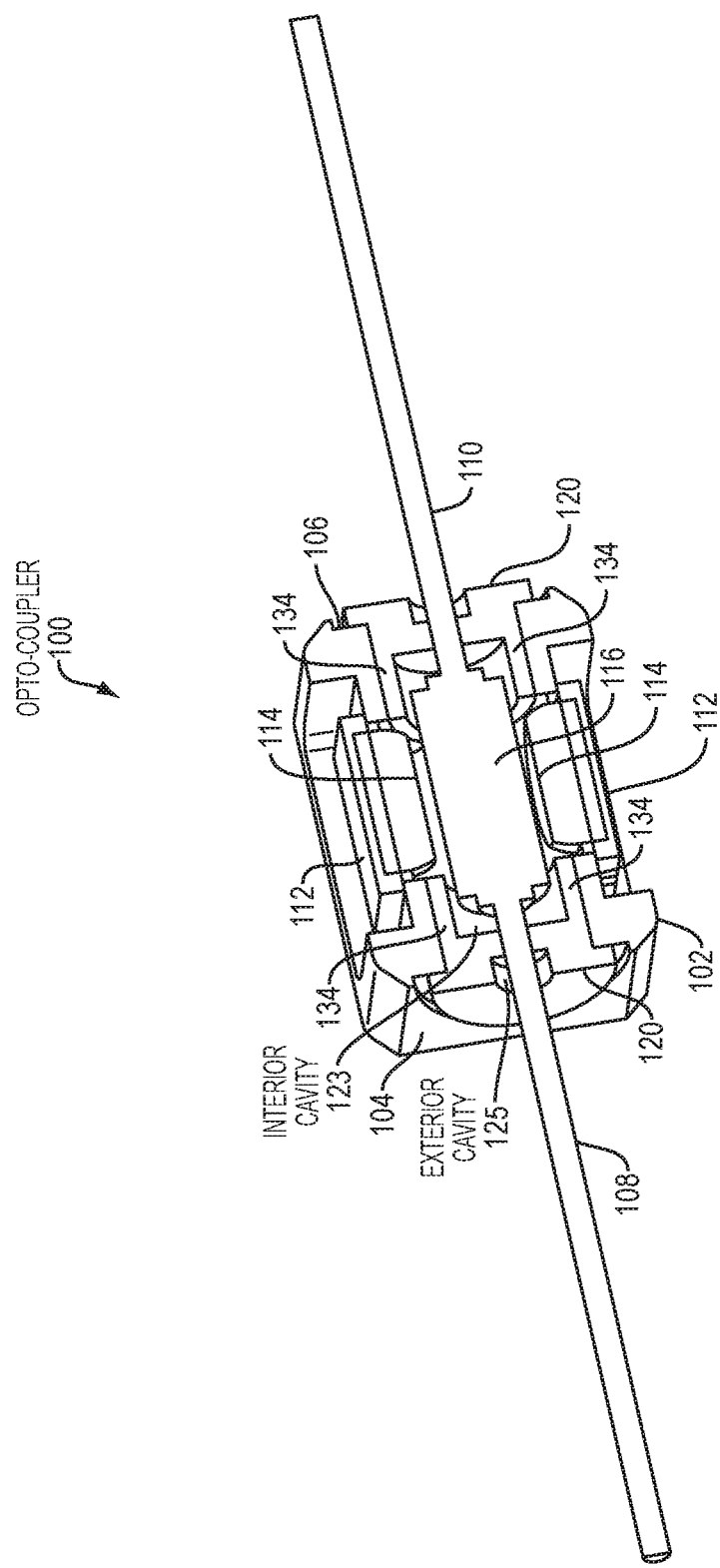
FIG. 1B is a perspective, cross-sectional illustration of the opto-coupler illustrated in FIG. 1A with a different cross-sectional orientation.

The opto-coupler 100 also includes at least one light-emitting diode (LED) 112 mounted to the housing 102, either directly or indirectly. As illustrated in FIG. 1B, the opto-coupler 100 also includes an optional second LED 112 mounted to a wall of the housing 102 that is opposite the wall to which the first LED is mounted. In the opto-coupler 100, each LED 112 is an LED bank housing including four individual LEDs that are not individually visible in FIGS. 1A-1B. However, individual diodes in LED banks are illustrated and described hereinafter in connection with FIGS. 6A-7C for various specific configurations. In other embodiments, further additional individual LEDs are included for redundancy and reliability purposes. For example, some embodiments include two to four LEDs, four to eight LEDs, or eight to 64 LEDs mounted to an opto-coupler housing in one or more LED bank housings. The greater number of LEDs can provide operational redundancy in case of a failure of one or more of the LEDs. Multiple LEDs can also increase the efficiency of activation of the HV diode and increase CTR. The one or more LEDs are configured to activate the HV diode 116 that is situated within the housing 102 to pass electrical current from the HV input conductor 102 to the HV output conductor 110. The LEDs perform this activation function by emitting light toward an active portion 118 of the HV diode.

The opto-coupler 100 further includes at least one press-fit end cap 120 that is configured to provide a press-fit seal 122 either between the HV input conductor 108 and the input end wall 104 or between the HV output conductor 110 and the output end wall 106. The opto-coupler 100 includes two press-fit end caps, one on the input side and one on the output side. The press-fit end caps 120 are configured to protect the LEDs 112 from damage by shaping an electric field that exists between the HV input or output conductor and the LEDs. The principle of shaping the electric field to prevent damage to the LEDs, as used in this disclosure, is described in greater detail in connection with FIGS. 4A-4C. In the case of the opto-coupler 100, this field shaping is accomplished by extensions 134 of the end caps 120. These extensions extend from the portions of the end caps at the outer walls of the housing 102 towards a gap between the HV diode and the LED. For example, the end cap 120 at the input side has extensions 134 that extend from the input end wall toward a gap between the HV diode 116 and the LEDs 112. In view of the disclosure herein, and the corresponding drawings, including illustrations in FIGS. 1A-1B and 4A-4C, a person of ordinary skill in the art will understand that various particular configurations for the extensions or other alternative features of the press-fit end caps may be provided to diminish the electric field strength between the high-voltage input or output and the LEDs, thus protecting the LEDs from damage.

The extensions 134 of the opto-coupler 100 surround inactive portions of the HV diode 116 and form an interior cavity 123 that is interior to the housing. The interior cavity surrounds the HV input conductor at a side of the input end wall 104 that is interior to the housing 102, as particularly illustrated in FIG. 1B. A similar interior cavity is formed by the extensions 134 on the output side of the opto-coupler 100. The press-fit end caps 120 also form exterior cavities 125 between the HV input and output conductors and the respective end caps and exterior to the housing 102. The at least one LED can include two or more LEDs configured to be driven electrically in parallel with mirrored current.

The housing 102 and the end caps 120 of the opto-coupler 100 are formed of Gigahertz OPTIK® ODM98 sintered Teflon material. However, other embodiments can be formed with the housing, end caps, or both formed of polyether ether ketone (PEEK) or ULTEM™ 1000, for example. ODM98 material has the advantage of being up to 98% reflective in infrared (IR) regions of interest. Accordingly, stray light from outside of the housing 102 will not appreciably affect the HV diode 116 by, for example, partial activation. Instead, the HV diode 116 will be optically isolated from exterior light, resulting in better performance. The reflective property of the ODM98 eliminates the need for coating the housing walls with an opaque, reflecting "paint". In the example prior art opto-couplers, such reflecting paint was made by adding titanium dioxide, for example, to a clear encapsulant potting material that is typically disposed within the interior regions of the housing. In the opto-coupler 100 of FIG. 1A, the clear encapsulant potting material may be disposed in the interior regions of the housing 102 that are not otherwise filled by the LED lens, HV diode, or extensions 134. However, because of the reflective properties of ODM 98, the addition of reflective paint is not necessary.

The press-fit end caps 120 illustrated in FIGS. 1A-1B are also further configured to reduce exposure of optically inactive regions of the HV diode 116 to light emitted by the LEDs. As illustrated in these figures, because the extensions 134 are disposed to surround the inactive portions of the HV diode 116 (portions other than the active portion 118), light from the LEDs 112 is directed more efficiently to the active portion of the HV diode 116, increasing current transfer ratio (CTR). ODM98 has an advantage of having a reflectance of up to 98.5% at visible wavelengths and a minimum reflectance of 93% within a wavelength range of 250 nm to 2.5 µm. This high reflectance both increases coupling efficiency of light emitted by the LEDs to the active portion of the HV diode and also reduces any noise created by light external to the housing that impinges upon the housing.

The press-fit end caps 120, with their extensions 134, are one means for providing electric field isolation for the LEDs 112 to prevent arc discharge damage to the LEDs. As is known, an HV electrode (e.g., input conductor 108) connected to an HV diode (e.g., HV diode 116) will generally have an arc discharge radius or non-symmetric distance from itself within which arc discharge damage may occur. The end caps 120 with extensions 134 can prevent such arc discharge damage within a smaller radius of HV diode and HV electrode than would otherwise be possible without the end caps and extensions.

In the embodiment illustrated in FIGS. 1A-1B, both the input and output HV conductors include press-fit end caps positioned thereon. These press-fit end caps facilitate alignment of the HV diode in the package during manufacturing. The press-fit nature of the end caps also enables the cavity of the housing 102 to be enclosed to enable potting material to be added to the interior of the housing. As further described herein, the end caps provide for field cancellation or reduction and increased electron creep path between the HV conductors and ground points. Since the HV diode can be utilized for both positive and negative polarity applications, extreme fields may be present on either side of the opto-coupler, whether considered the "input" or "output" side. In order to facilitate sealing of the opto-coupler and alignment of the HV diode within the package, it is advantageous for the interface between the end caps and the housing sidewalls to be press-fit, as well as for the interface between the HV conductors and the end caps to be press-fit.

FIG. 1B is a perspective, cross-sectional illustration of the opto-coupler 100 illustrated in FIG. 1A. The cross section for FIG. 1B, however, is through a different wall than the cross-sectional illustration shown in FIG. 1A, such that both of the LEDs 112 are visible in FIG. 1B.

Figure 2E:
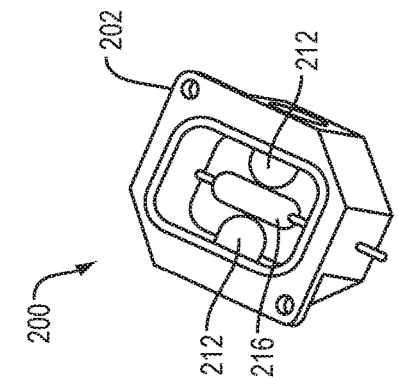
FIGS. 2B-2E are perspective-view illustrations of prior art opto-couplers that are described in detail in U.S. Pat. Appl. Pub. No. 2007/0045800.
Figure 2C:
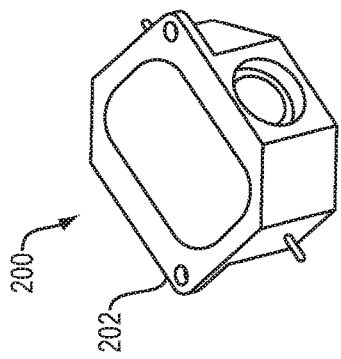
Figure 2D:
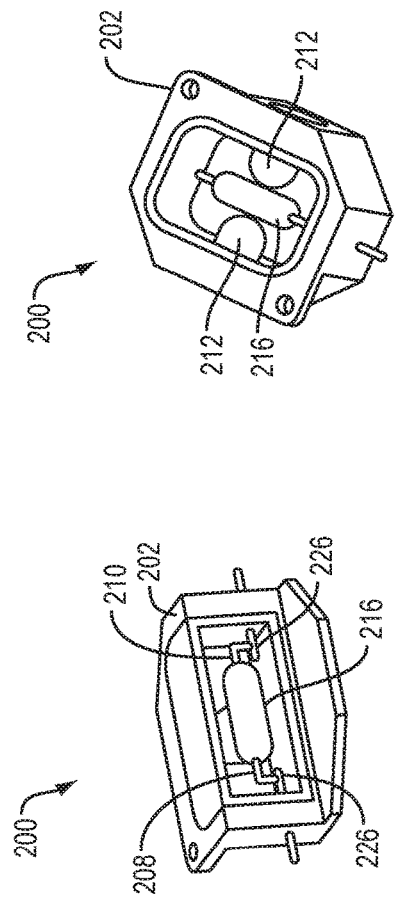
Figure 2A:
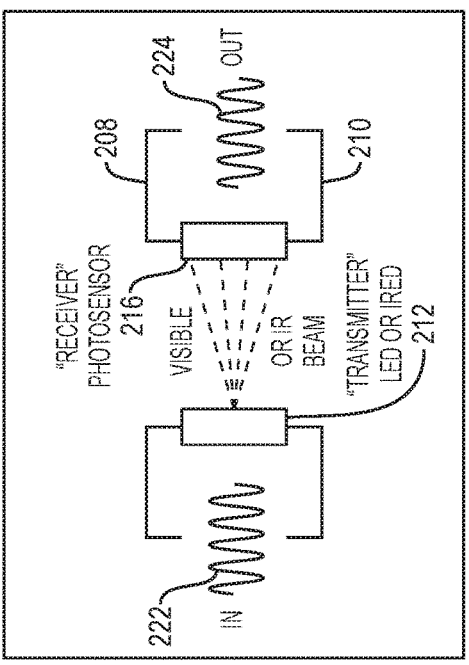
FIG. 2A is a schematic diagram illustrating the basic operation of a prior art opto-coupler.
Figure 2B:
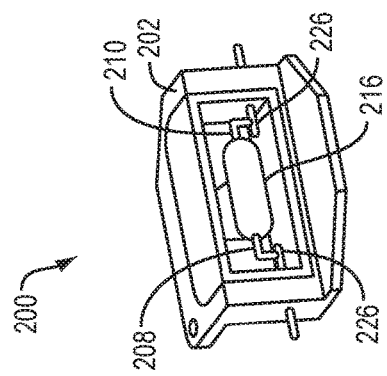

FIG. 2A is a schematic diagram illustrating the basic operation of an opto-coupler, as known in the prior art. The drive signal 222, which can be variable, is used to drive a transmitter 212, which can be a visible or an infrared (IR) LED, for example. Visible or IR light is emitted toward a "receiver" (i.e., photosensor, HV diode) 216. The modulated visible or infrared light produces conduction electrons in the bandgap of the HV diode, which controls the current through the diode. The current 224 through the diode 216, from an input conductor 208 to an output conductor 210, may be variable and may be controlled based on the input current 222 used to drive the transmitter 212. The opto-coupler solution is preferred to mechanical relays because of the lack of moving parts, long life, small size, fast response time, and compatibility with semiconductor circuits. Opto-couplers can be highly efficient in HV circuits, in part because power consumed in the OFF state is nearly zero.

FIGS. 2B-2E are perspective-view illustrations of prior art opto-couplers that are described in detail in U.S. Pat. Appl. Pub. No. 2007/0045800, which is incorporated herein by reference in its entirety. As illustrated in FIGS. 2B-2E, various prior art opto-couplers 200 include a housing 202 and input and output conductors 208 and 210, respectively. The conductors either extend straight from the HV diode photosensor 216 through the sidewalls of the housing or are disposed on standoffs 226. Both the interior and exterior cavities 123 and 125, respectively, have the effect of increasing path lengths for any electron creep from the high-voltage conductors to ground. The electron creep may also be referred to herein as leakage current. Even though optional, these interior and exterior cavities are preferable to protect the opto-coupler further from degradation and failure, as well as to protect surrounding circuit components, such as a circuit board on which the opto-coupler is mounted.

Figure 2F:
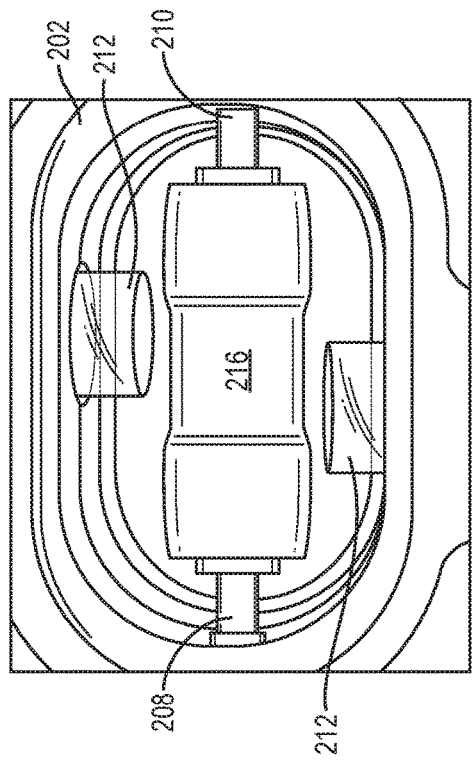
FIG. 2F is a photograph of the prior art opto-coupler that is illustrated in FIG. 2E.

FIG. 2F is a photograph of the prior art opto-coupler 200 that is illustrated in FIG. 2E.

Figure 2G:
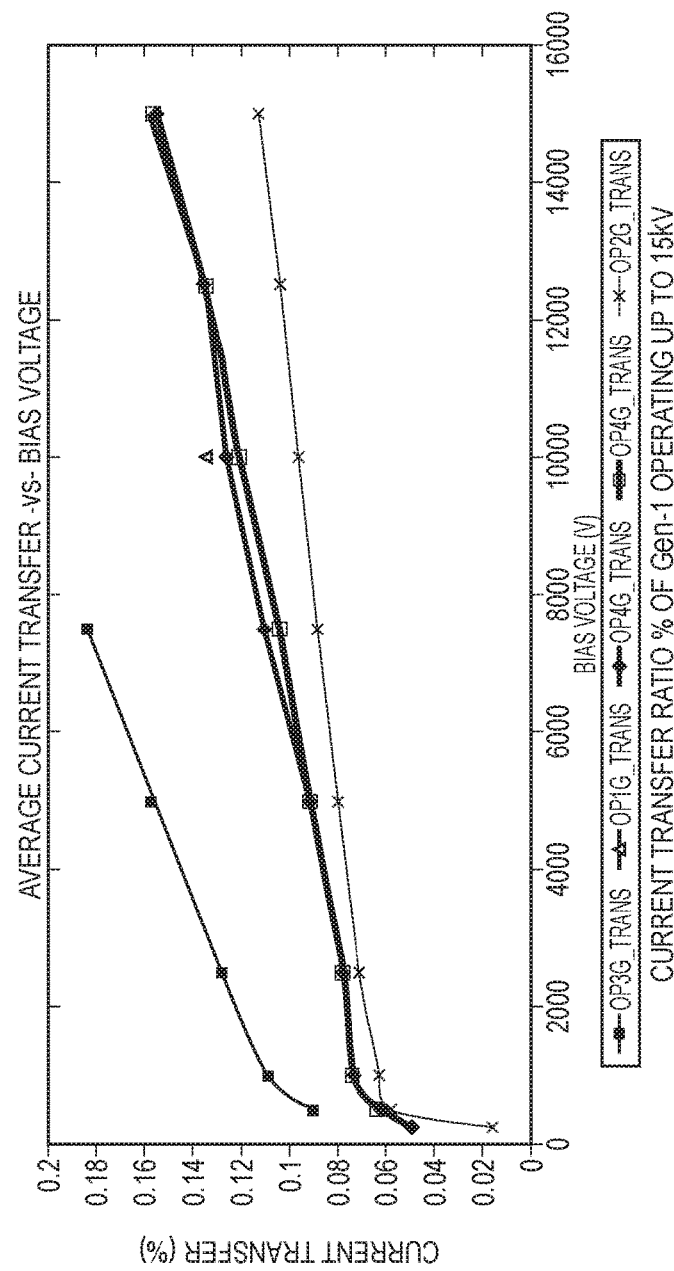
FIG. 2G is a graph showing current transfer ratios (CTRs), in percentages, as functions of bias voltage across the HV diode for prior art opto-couplers operating at up to 15 kV.

FIG. 2G is a graph showing CTRs, in percentages, as a function of bias voltage across the HV diode for existing opto-couplers operating up to 15 kV. As illustrated in FIG. 2G, CTRs for prior art opto-couplers are limited to under 0.2%. In contrast to the CTRs illustrated in FIG. 2G for existing opto-couplers, CTRs can be much higher for embodiment opto-couplers described herein, such as on the order of 10 times greater, for example. Certain CTRs for embodiment opto-couplers described herein are described in connection with FIG. 9A, for example.

FIGS. 3A-3B are perspective-view illustrations of an alternative embodiment opto-coupler 300. Like the embodiment illustrated in FIGS. 1A-1B, the opto-coupler 300 has a housing 302 with sidewalls allowing protrusion of input and output high-voltage conductors 108 and 110, respectively, to protrude therethrough. The HV diode 116, which is disposed between two LEDs 112, electrically joins the input and output high-voltage conductors. The opto-coupler 300 includes two end caps 320 that perform certain functions similar to the end caps illustrated in FIGS. 1A-1B.

FIG. 3B is a perspective-view illustration of the opto-coupler 300 in FIG. 3A, but FIG. 3B also shows a top housing cover 328 that is configured to be placed on the housing, to form the complete opto-coupler 300. The top housing cover 328 forms part of the housing of the completed opto-coupler 300 and seals the opto-coupler closed after encapsulant material is placed within the opto-coupler cavity during manufacture and the encapsulant material is allowed to cure.

Figure 4A:
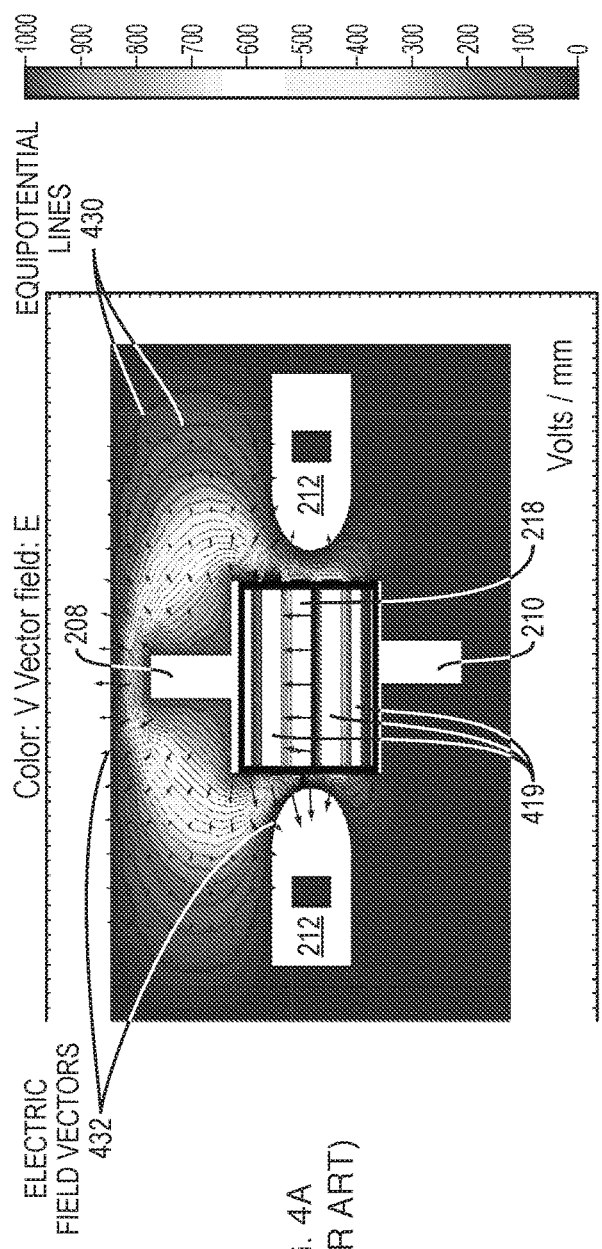
FIG. 4A is a graph showing calculated electric potential inside a representative prior art opto-coupler having two LEDs configured to activate an HV diode.
Figure 4B:
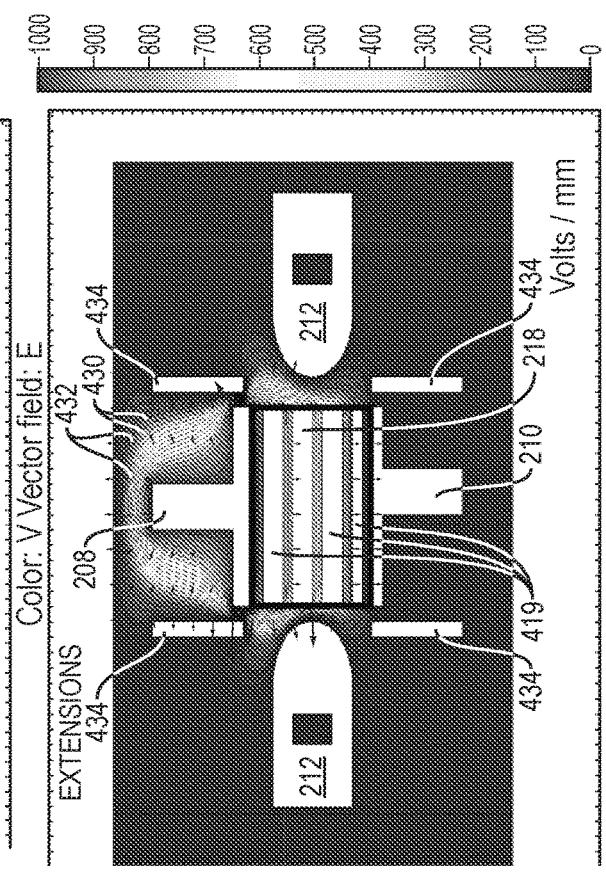
FIG. 4B is a graph illustrating calculated electric potential for an embodiment opto-coupler, wherein the electric field is shaped by press-fit end cap extensions such as those illustrated in FIGS. 1A-1B.
Figure 4C:
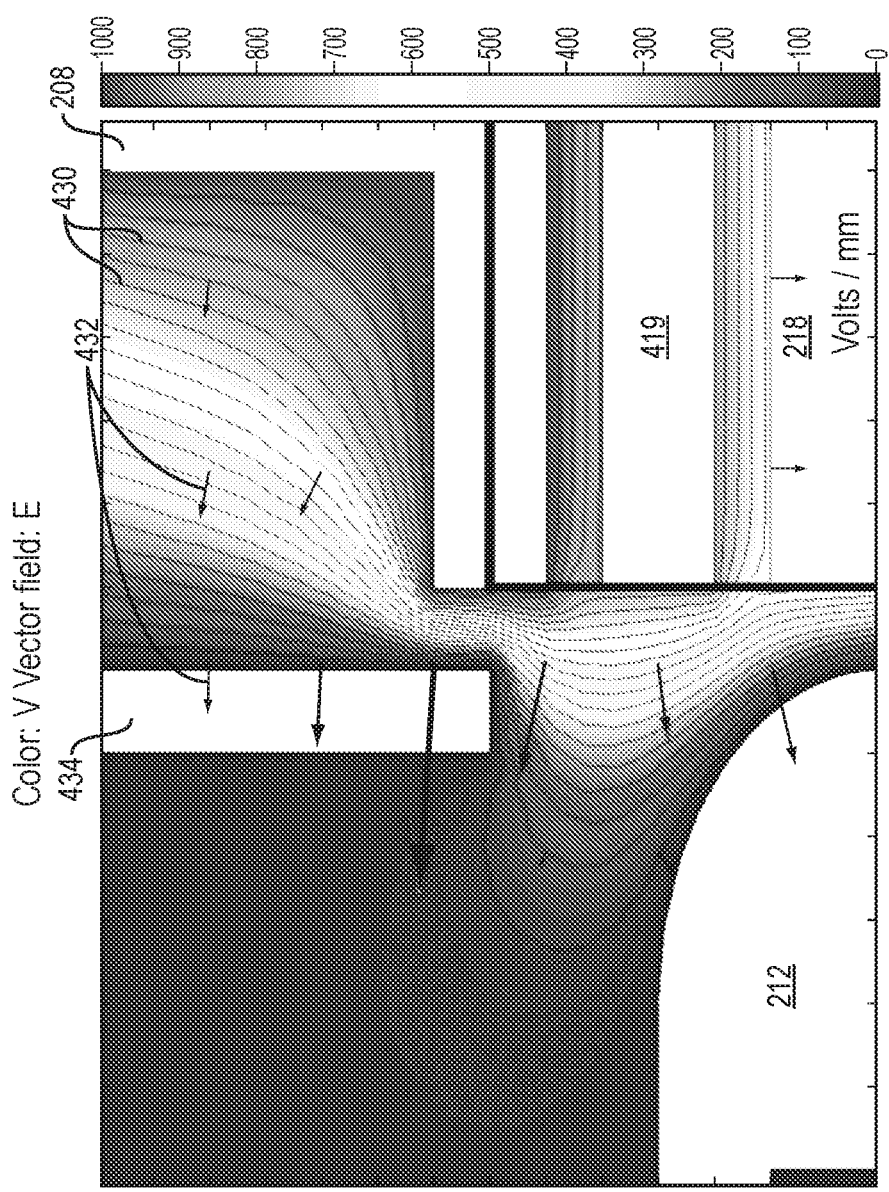
FIG. 4C is a close-up illustration of an upper right portion of the graph shown in FIG. 4B, showing the field-shaping property of the press-fit end cap extensions between the HV diode and LED in greater detail.

FIGS. 4A-4C are graphs illustrating the effect of extensions similar to those illustrated in FIGS. 1A-1B on the electric potential in regions around activating LEDs. FIG. 4A is a graph showing the electric potential for a representative prior art opto-coupler having the two LED banks 212 configured to activate the HV diode 216. The prior art opto-coupler of FIG. 4A does not include press-fit end caps that are included in some embodiment opto-coupler configurations. The HV diode 216 includes a central portion 218 and outer portion 419 situated between the high-voltage input and output conductors 208 and 210, respectively. Together, the HV diode is formed of flat conductor portions of the HV conductors 208 that are adjacent to the diode, as well as a stack of HV diode sections, such as the central section (portion) 218 and outer portions 419. While a stack of four HV diode sections is illustrated in FIGS. 4A-4B, other HV diodes may be comprised of as many as 10-15 silicon wafer chips, for example. Equipotential lines 430 surrounding the HV input conductor 208 illustrate locations of equal electric potential surrounding the HV input conductor and HV diode. Electric field vectors 432, which point in the direction of the gradient of electric potential at any given location, are also illustrated. As illustrated in FIG. 4A, the equipotential lines 430 extend a significant distance outward toward the LEDs 212.

In existing opto-couplers, such as that shown in FIG. 4A, there are competing considerations as an opto-coupler becomes smaller. In particular, it can be desirable for an opto-coupler to be smaller and more compact. This can be a benefit in high-voltage board design and can potentially increase CTR for the opto-couplers by decreasing distance and increasing coupling efficiency between the activating LEDs and the HV diode. However, a competing consideration is that with sufficiently close proximity, the LEDs can be damaged by the strength of the electric field resulting from the high-voltage input conductor 208 and surrounding components. Thus, the voltage at which the HV diode and opto-coupler may operate will be limited by the potential for damage to the LEDs and package size becomes large as the desired operational voltage is increased. While potting material that typically surrounds the HV diode and LEDs can assist in reducing field strength, the reduction in field strength is limited and will not be sufficient for high operating voltages.

FIG. 4B, in contrast to FIG. 4A, is a graph illustrating the electric potential for an embodiment opto-coupler that includes press-fit end caps with extensions 434. The extensions 434 extend from a press-fit end cap similar to those illustrated in FIGS. 1A-1B, which surround the HV input and output conductors and force a reduction in field strength near sensitive portions of the LEDs 212. For example, the end caps or extensions thereof may cause portions of the shaped electric field to cancel or substantially cancel each other out, thereby having an effect of reducing the electric field at a location of the LEDs to acceptable levels for preventing damage to the LEDs. The end caps or extensions thereof, result in a stronger electric field gradient over a smaller distance than in the prior art configuration of FIG. 4A, which lacks press-fit end caps disposed in the space between the high-voltage conductors and the LEDs.

FIG. 4C is a close up illustration of an upper right portion of the embodiment shown in FIG. 4B. Thus, FIG. 4C is a more detailed visualization provides a more detailed visualization of the impact of the extensions 434 in reducing electric field strength around critical portions of the LED 212. In the opto-coupler illustrated in FIGS. 4B-4C, it can clearly be seen that the field distribution lines are far more contain when the end caps, with the extensions thereof, are used, in comparison with the prior art design illustrated in FIG. 4A. Furthermore, the field goes to 0 V per millimeter more readily in FIGS. 4B-4C due to the field cancellation that occurs at the interfaces of the two media, namely the end cap and the optical potting material. The illustration shown in FIGS. 4B-4C uses 1 kV as an excitation parameter, but this is a linear function until dielectric breakdown begins to occur. For this, the opto-coupler has been designed with a factor of two margin, allowing the opto-coupler to be scaled and to operate safely at higher voltages, such as 10 kV or 15 kV, for example. The concern regarding electron creep (leakage current) to and from the housing and the LED in prior art configurations is no longer present in embodiment devices, as it is directed to the very capable HV diode.

Figure 5B:
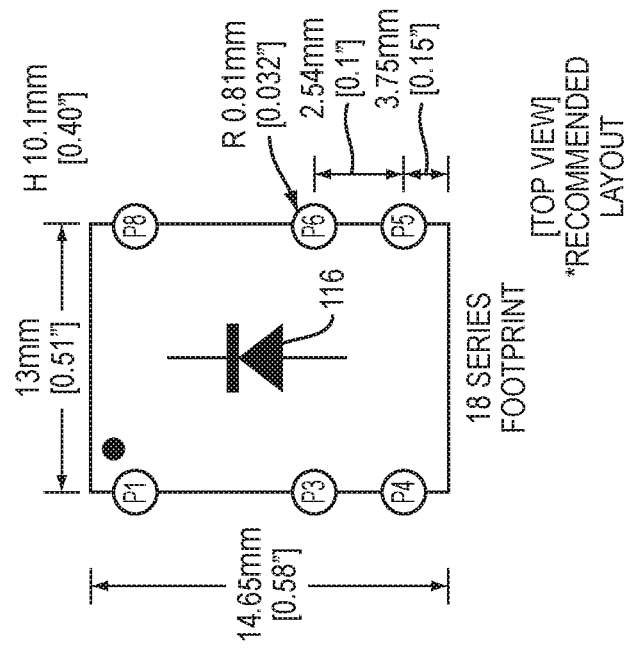
FIGS. 5A-5B are illustrations showing printed circuit board footprint layouts for some embodiment opto-couplers.
Figure 5A:
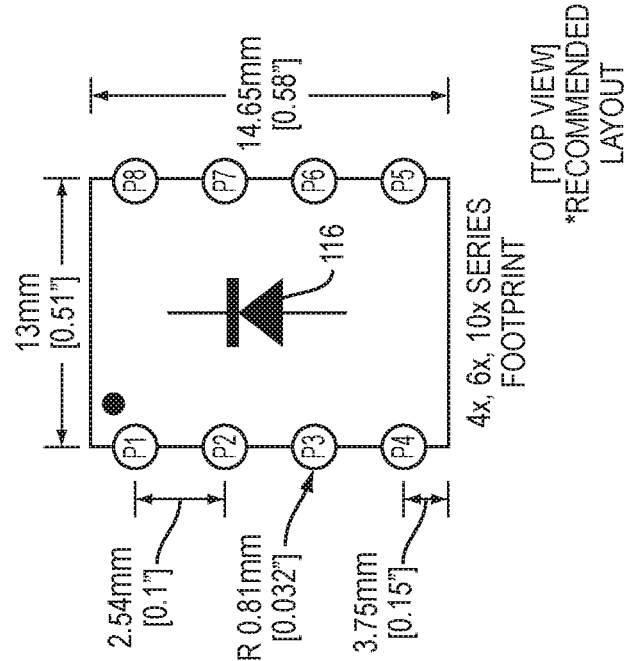

As illustrated in FIGS. 4B-4C, extensions of press-fit end caps as described herein can reduce the electric field strength resulting from HV conductors around the activating LEDs, allowing embodiment opto-couplers to be smaller and to operate at much higher operating voltages. For example, a press-fit end cap on one embodiment can be configured to enable the HV input conductor to be operated continuously at up to 8 kV relative to the LED without damaging the LED. This can be accomplished using a combination of the extensions 434 illustrated in FIG. 4B, together with potting material held within the housing. Furthermore, in some embodiments, the press-fit end cap can be configured to enable the HV input conductor to be operated continuously at up to 15 kV relative to the LED without damaging the LED, also in conjunction with potting material held within the housing, and with the dimensions of the housing scaled appropriately. FIGS. 5A-5B are illustrations showing footprint layouts for various embodiment opto-couplers. The embodiment illustrated in FIG. 5A has an eight pin configuration, with eight pins P1-P8, while the embodiment in FIG. 5B has six pins P1-P6. Each of the embodiments in FIGS. 5A-5B has a width dimension of 13 mm and a length dimension of 14.65 mm. It should also be noted that the footprint layouts illustrated in FIGS. 5A-5B do not show the angled corners that are present in certain embodiment housings, such as those illustrated in FIGS. 1A-1B. However, these angled corners for the opto-coupler housings are illustrated in greater detail in FIG. 8D-1, for example.

The circuit board layout footprint dimensions illustrated in FIGS. 5A-5B illustrate how compact embodiment opto-couplers can be. As illustrated in FIGS. 5A-5B, various embodiments can have circuit board layout footprint dimensions as small as 13 mm×14.65 mm, where footprint dimensions should be understood to be in format of width (e.g. 13 mm) by length (e.g. 14.65 mm) unless otherwise stated. The footprint layouts in FIGS. 5A-5B relate to various embodiments that include press-fit end caps as illustrated in FIGS. 1A-1B and have various LED drive voltage configurations in ranges of about 4 V, 6 V, 10 V, 18 V, etc., corresponding to the 4X, 6X, 10X, and 18 series footprints illustrated in FIGS. 5A-5B, respectively. An "X" in these embodiment configuration designations indicates that the corresponding embodiment opto-coupler may be designed for NPN or PNP transistor configurations. The NPN or PNP diode configurations permit mirrored current operation for any LED configurations that include one or more LEDs that are configured to be driven in parallel electrically. Various LED configurations that can be used in connection with embodiment opto-couplers are further described hereinafter in connection with FIGS. 6A-6D and 7A-7C. In further detail, both of the embodiments corresponding to FIGS. 1A-1B and 3A-3B, respectively, may have their activating LEDs configured in a serial, parallel, or a combination electrical drive configuration.

In other embodiments, dimensions can be larger than those shown in FIGS. 5A-5B, such as high as length 0.865 inches×width 0.750 inches×height 0.400 inches or greater. Nonetheless, it should be understood that decreased opto-coupler size, as measured by footprint dimensions, can be a significant advantage of embodiment opto-couplers that include press-fit end caps. As is understood generally in the arts of high-voltage electrical design, two electrodes differing in voltage, or one high-voltage electrode differing in voltage from a ground point, should generally have a gap between them of at least 1 kV per millimeter to avoid discharge and damage. An example of such a gap includes a distance between the HV input conductor 108 illustrated in FIG. 1A and a circuit board ground point to which the opto-coupler 100 is attached (not shown in FIG. 1A). This rule of thumb generally provides a lower limit on opto-coupler dimensions with the opto-coupler operating at a particular high voltage. However, consistent with embodiments described herein, such as the opto-coupler 100 illustrated in FIGS. 1A-1B, opto-couplers may have smaller dimensions, such as smaller circuit board layout footprint dimensions, then the 1 kV per millimeter rule of thumb would typically allow. For example, the embodiment of FIGS. 1A-1B is rated to operate at 8 kV, yet has footprint dimensions of 13 mm×14.65 mm. Furthermore, these footprint dimensions may be even smaller in other embodiments, or, correspondingly, the embodiment illustrated in FIGS. 1A-1B may also be safely operated at up to 10 kV or higher voltages, for example.

For a higher operating voltage of 15 kV, for example, and opto-coupler housing size consistent with embodiments described herein may be larger than the dimensions illustrated in FIGS. 5A-5B by about 1 mm in each dimension for every 1 kV increase in voltage rating. For a 15 kV configuration, and opto-coupler may be 7 mm greater in length or width than the footprint dimensions illustrated in FIGS. 5A-5B, for example. Similar considerations apply in opto-coupler height dimensions.

The circuit board footprint layouts illustrated in FIGS. 5A-5B are example dimensions of a top or bottom side of an embodiment opto-coupler. Top or bottom sides of embodiment opto-coupler housings may be substantially square in shape, such as the footprints illustrated in FIGS. 5A-5B. In FIGS. 5A-5B, the aspect ratio of the opto-couplers, defined by the width divided by the length (13 mm÷14.65 mm=0.89) may be close to 1, indicating a top or bottom side that is substantially square in shape. These are example dimensions for an 8 kV rated design, which are in a range of about 13 mm×about 15 mm. Other examples of substantially square shapes, as it should be understood in this disclosure, can be 0.7-1.3, for example.

Various embodiment electrical configurations are indicated by the designations 4X, 6X, 10X, 18, etc. These designations should be understood as follows. For example, in the 4X configuration, at positive or negative maximum LED drive current, a power supply having positive or negative (+ or −) 4 V is needed to drive the LEDs. Further, the "X" indicates that the diodes can be operated in a mirrored current configuration that includes transistors that are in the NPN configuration or PNP configuration, as determined by the polarity of the drive current, as will be understood by a person of ordinary skill in the electrical design. In further detail:

4: at ±Max current, the drive diodes needs ±4V and can be configured using x=(n) NPN or (p) PNP 6: at ±Max current, the drive diodes need ±6V and can be configured using x=(n) NPN or (p) PNP 10: at ±Max current, the drive diodes need ±10V and can be configured using x=(n) NPN or (p) PNP 18: at ±Max current, the drive diodes need ±18V (no current mirroring applies for this version)

Figure 6D:
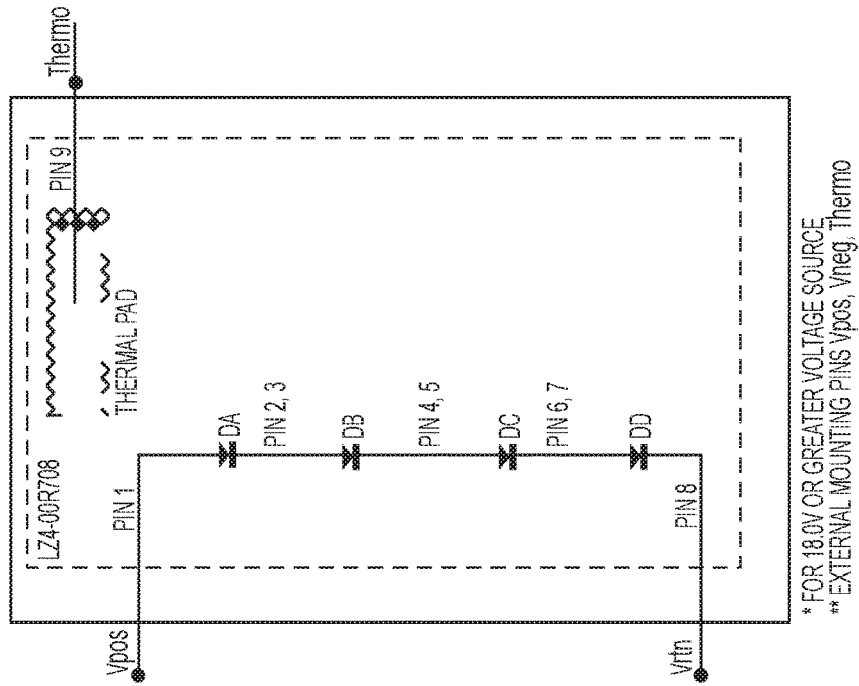

FIGS. 6A-6D are schematic diagrams illustrating an electrical configuration corresponding to the opto-coupler 100 illustrated in FIGS. 1A-1B, when operated with an NPN configuration for drive LED current mirroring. In particular, FIG. 6A shows an electrical configuration for an LED pack that includes four LEDs DA, DB, DC, and DD intended to be placed on one side of an opto-coupler, such as the LED pack 112 illustrated in FIGS. 1A-1B. A similar LED pack including LEDs DA-DD can be included on the opposite side of the opto-coupler. The LEDs DA-DB are in series, as are the LEDs DC-DD. However, the two stacks DA-DB and DC-DD are driven in parallel. A current mirror 680 is included in FIG. 6A, which includes two transistors Q1A and Q1B, whose base terminals are tied together. The current mirror 680 forces current to be equal in each of the parallel stacks DA-DB and DC-DD. In the case of FIG. 6A, the current mirror 680 has an NPN configuration for the diodes.

FIG. 6B also includes a current mirror configuration, but each of the diodes DA-DD is electrically driven in parallel to the others. In this case, two current mirrors 680 are used, and the two current mirrors are tied together at their base terminals in order to force current to be equal through each of the four drive LEDs. The configuration of FIG. 6B requires only a 4.1 V or greater voltage source, while the configuration of FIG. 6A requires a 6.2 V or greater voltage source.

Figure 6C:
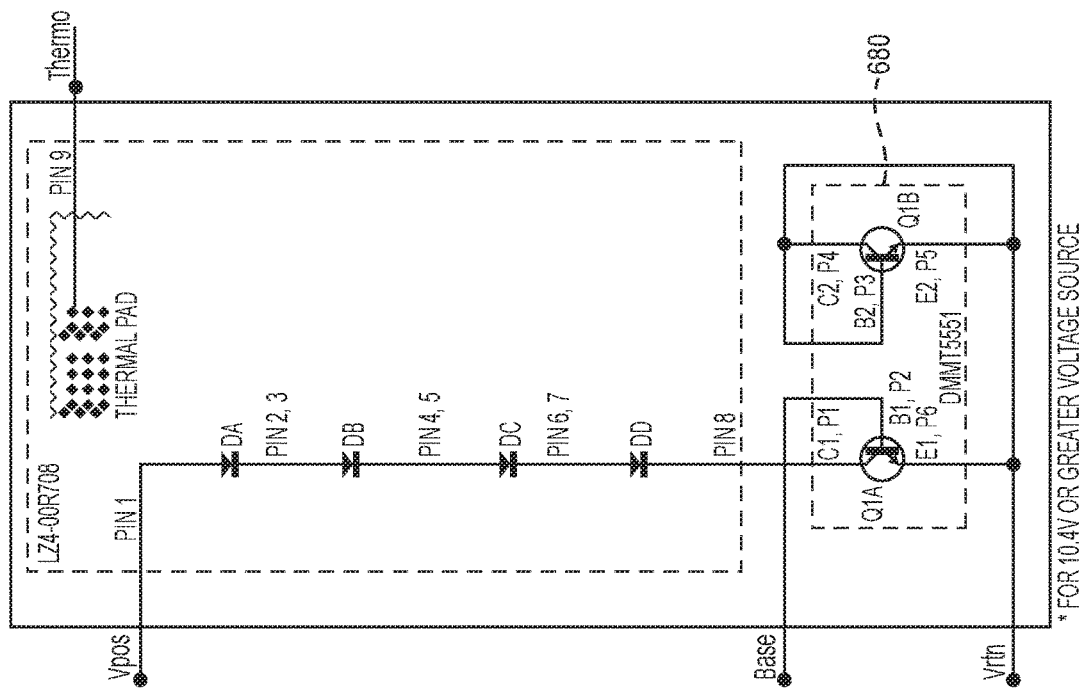

FIG. 6C shows a similar configuration for the four LEDs DA-DD being driven in series with each other. The configuration of FIG. 6C can be used with a 10.4 V or greater voltage source.

FIG. 6D shows an alternative electrical configuration for the four LEDs DA-DD operated in series with each other without current mirroring using an 18.0 V or greater voltage source.

Figures 7A, 7B:
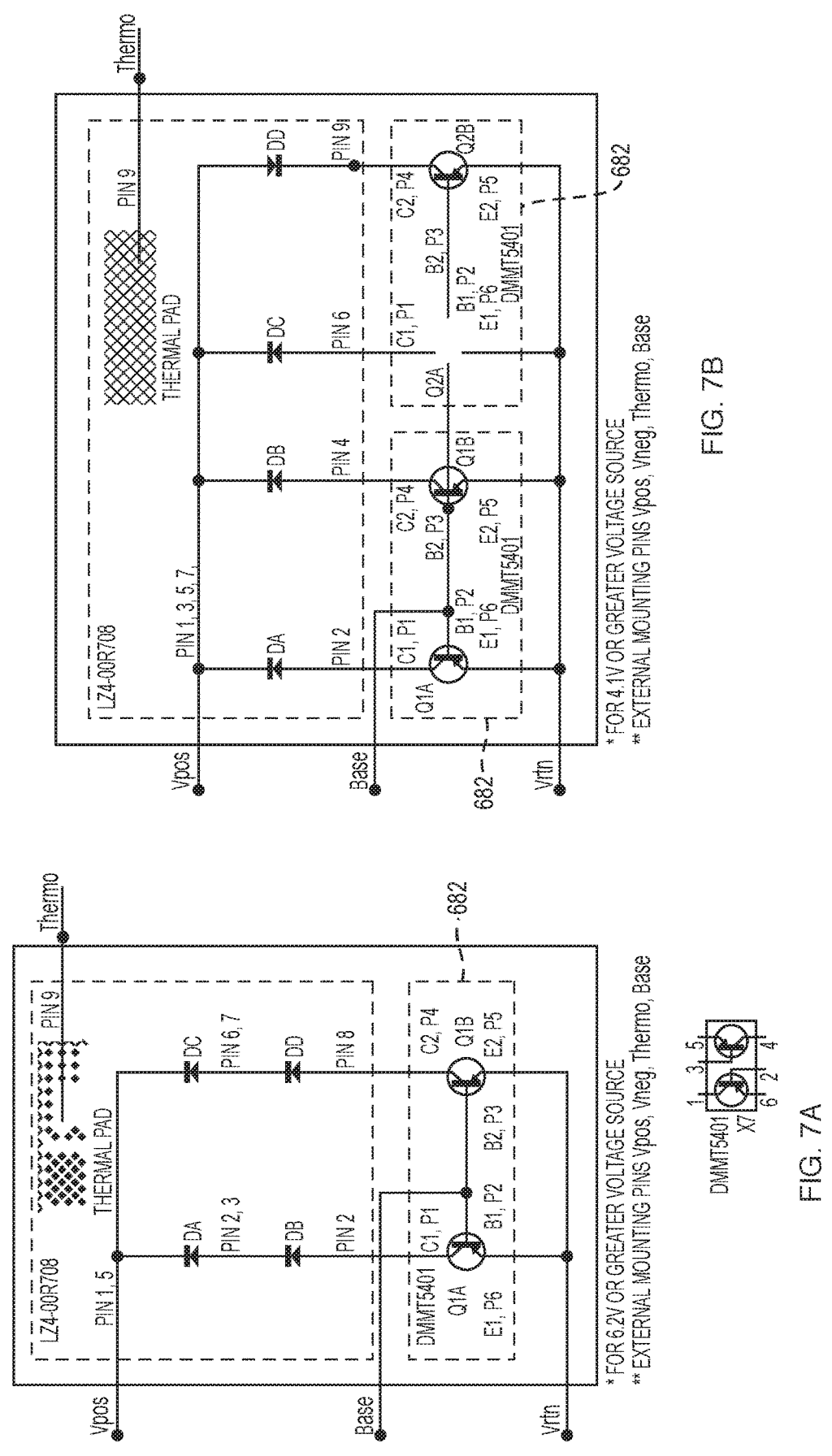

FIGS. 7A-7C are schematic diagrams showing an electrical configuration for the opto-coupler 100 illustrated in FIGS. 1A-1B, used in a PNP configuration for drive LED current mirroring. PNP transistors are for use in negative circuit requirements, whereas the NPN configurations illustrated in FIGS. 6A-6D are applicable to positive drive circuits. In particular, FIG. 7A illustrates the four diodes DA-DD in a series-parallel configuration similar to that of FIG. 6A, except that the diodes are configured for negative electrical drive. A current mirror 682 includes two PNP transistors for current mirroring of the two parallel stacks.

FIG. 7B is similar to FIG. 6B, except that the four diodes in parallel are configured for negative drive voltage, and the two current mirrors 682 include PNP transistors, correspondingly.

FIG. 7C is similar to FIG. 6C, except that the four diodes in series are configured for negative drive voltage, and the current mirror 682 includes PNP transistors.

FIGS. 8A-8E are various illustrations pertaining to the opto-coupler 100 illustrated in FIGS. 1A-1B. In particular, FIGS. 8A-1 to 8A-3 illustrate the dimensions for the LED 112 with flattened lens 114. FIG. 8A-1 shows a side view of the LED 112, while FIG. 8A-2 is a profile-view illustration of the LED 112. The flattened lens 114 is configured to be situated in a path of the light emitted from the LED toward the active portion of the HV diode. The flattened lens 114 permits the LED to be placed in greater proximity to the HV diode, permitting better coupling of the light to the HV photodiode and, consequently, a higher CTR. In particular, as illustrated in FIG. 8E, gaps 836 between the lens of the LED and the active portion of the HV diode can be in a range of about 0.2 mm to about 0.5 mm, for example. The flattened lens 114 may be formed from a glass encasement in which the LED is encased. Such a glass lens may be easily machined in order to provide a thinner flat lens, which allows for the LEDs to be in closer proximity to the HV diode. FIG. 8A-3 illustrates design notes and tolerances for the LEDs 112 and flattened lens 114.

FIGS. 8B-1 to 8B-3 are a series of illustrations of the press-fit end caps 120 in the opto-coupler 100 in FIGS. 1A-1B. FIG. 8B-1 is a side view of the end cap. FIG. 8B-2 is an end view of the end cap 120, which also illustrates the orientation for a cross-sectional view A-A illustrated on the right of FIG. 8B. FIG. 8B-3 is a cross-sectional view of the end cap, with the cross-section A-A being illustrated in FIG. 8B-2. FIG. 8B-4 is a table and notes for engineering tolerances and manufacturing of the press fit end cap 120.

FIGS. 8C-1 to 8C-7 are various illustrations and specifications for the housing 102 illustrated in FIGS. 1A-1B. In particular, FIG. 8C-1 is a top view of the housing 102, while FIG. 8C-2 is a detailed view of a corner of the housing 102. FIG. 8C-3 is a cross-sectional end view, with the cross-section being shown in the side view illustrated in FIG. 8C-4. FIG. 8C-5 is an end view of the housing 102, and FIG. 8C-6 is a cross-sectional side view of the housing 102, with the cross-section illustrated in FIG. 8C-5. FIG. 8C-7 includes a table and notes showing engineering specifications for the embodiment housing 102.

FIG. 8D-1 is a top-view drawing of the housing top cover 128 illustrated in FIGS. 1A-1B. FIG. 8D-2 is a side view of the top cover 128 illustrated in FIG. 8D-1. FIG. 8D-3 includes a table and notes with tolerances and specifications for the top cover 128.

FIGS. 8E-1 through 8E-6 are various illustrations and specification for the opto-coupler 100 illustrated in FIGS. 1A-1B. In particular, FIG. 8E-1 is an isometric perspective view of the opto-coupler 100. FIG. 8E-2 is a cross sectional top view of the opto-coupler 100, with the cross-section being shown in FIG. 8E-4. FIG. 8E-3 is an end view of the opto-coupler 100, and FIG. 8E-4 is a side view of the opto-coupler 100.

FIG. 8E-5 is a cross-sectional end view of the opto-coupler 100 illustrated in FIGS. 1A-1B, with the cross section orientation illustrated in FIG. 8E-4. Illustrated, there are gaps 836 between the LED lenses 114, which are substantially flattened, and the HV diode 116. These gaps can be in a range of about 0.2 mm to about 0.5 mm, for example. FIG. 8E-6 is a table and list of specifications for the opto-coupler 100.

Figure 9A:
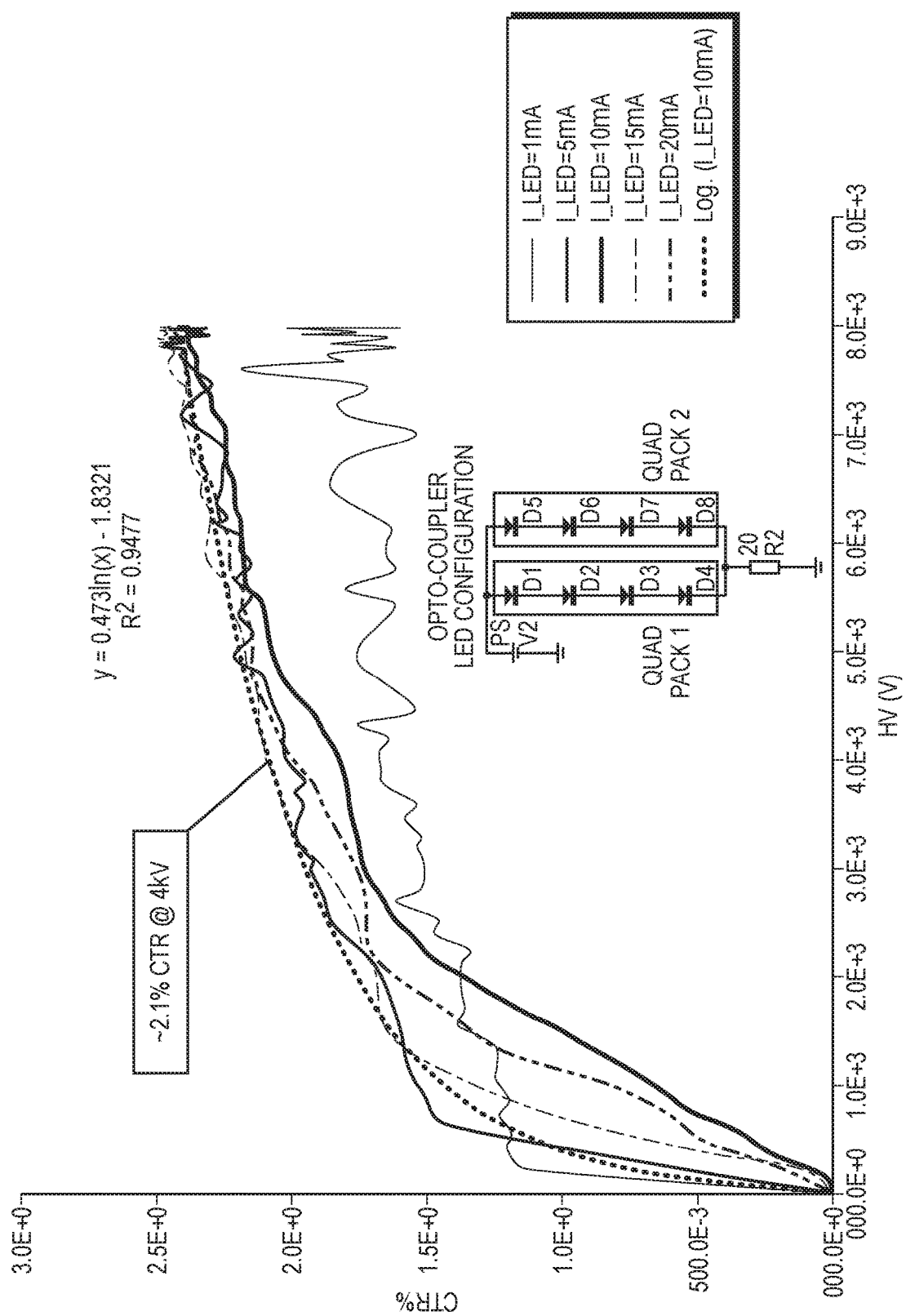
FIG. 9A is a graph illustrating CTR, as a percentage, as a function of operational voltage of the HV diode for various LED drive currents, for the opto-coupler illustrated in FIGS. 3A-3B.

FIG. 9A is a graph illustrating CTR, as a percentage, as a function of operational voltage of the HV diode 116, for the opto-coupler 300 illustrated in FIGS. 3A-3B. In particular, performance for the opto-coupler LED configuration illustrated in FIG. 9A is shown, including a dual quad pack LED configuration with a 20 ohm resistance to ground. As illustrated in FIG. 9A, embodiments can provide significant improvement in CTR, such as a factor of 10 higher than the CTR values illustrated in FIG. 2G for prior art opto-couplers. Furthermore, in other embodiments, the LED and press-fit end cap are configured to enable the opto-coupler to operate with a CTR between about 0.2 and about 4.0, between about 0.2 and about 3.0, or between about 1.0 and about 3.0, for example. Accordingly, in some embodiments, the press-fit end caps enable opto-couplers to operate with a CTR in a range of about 40 times greater than in existing opto-couplers.

Figure 9B:
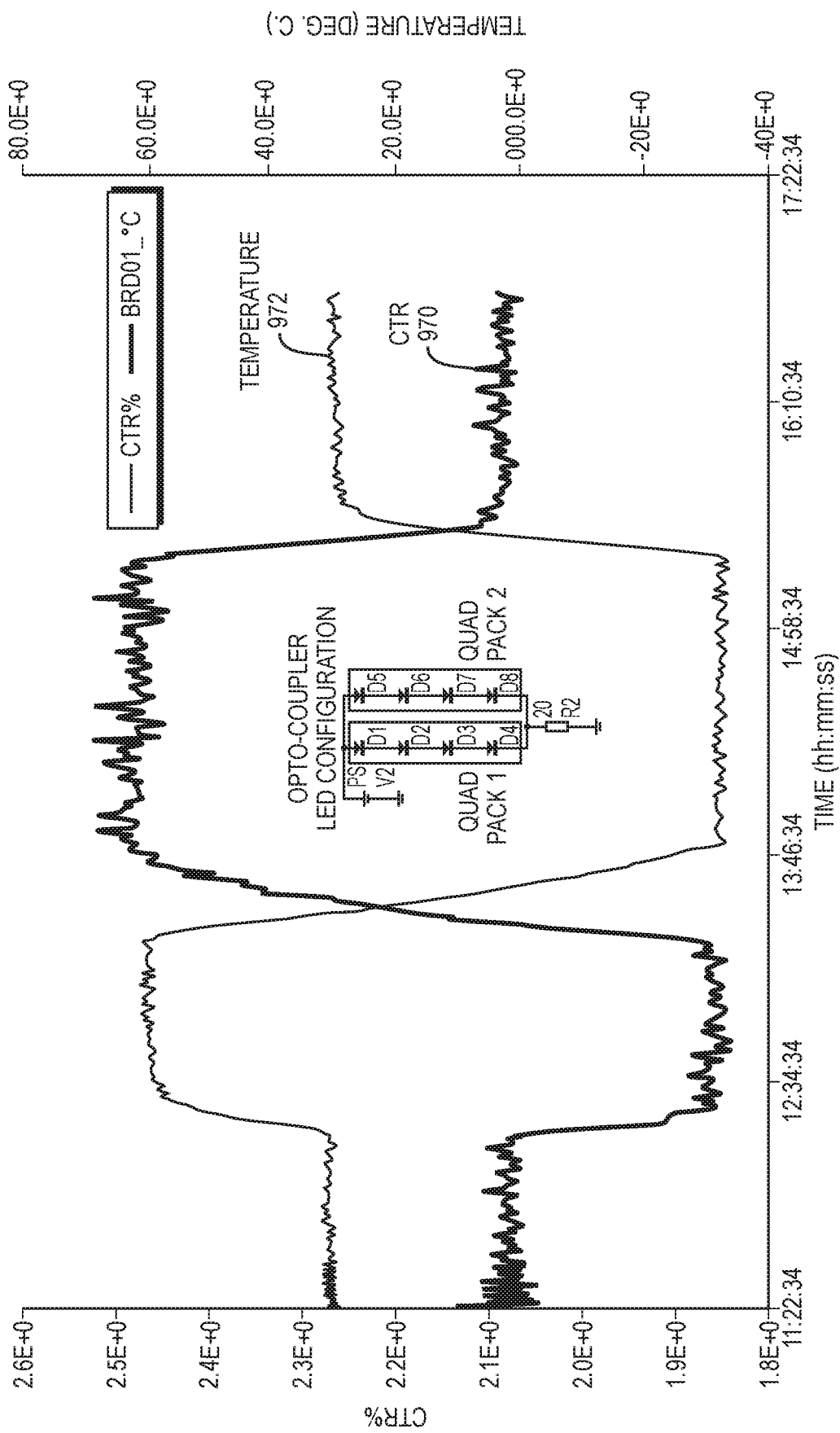
FIG. 9B is a graph illustrating CTR and temperature as a function of time for the opto-coupler illustrated in FIGS. 3A-3B.

FIG. 9B illustrates CTR 970 and temperature 972 as a function of time for the opto-coupler 300 illustrated in FIGS. 3A-3B. In particular, performance is shown for the dual quad pack LED configuration whose CTR as a function of high-voltage is provided in FIG. 9A.

Figure 9C:
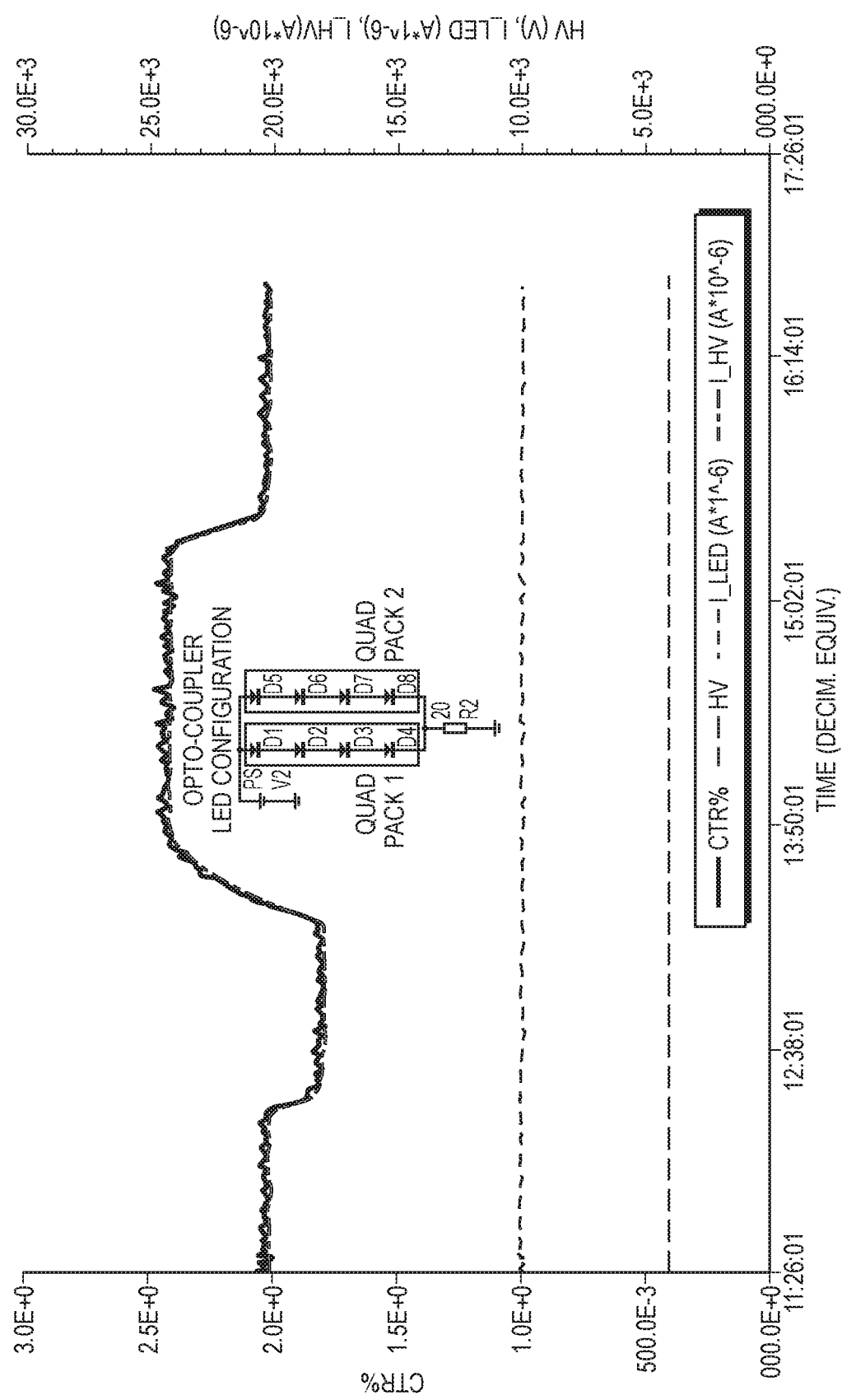
FIG. 9C is a graph illustrating of CTR as a function of time (in decimal equivalent values), high voltage, LED current I_LED, and high-voltage current I_HV through the high-voltage diode for the same LED configuration and measurement timeframe as FIG. 9B.

FIG. 9C is an illustration of CTR as a function of time (in decimal equivalent values).

Figure 9D:
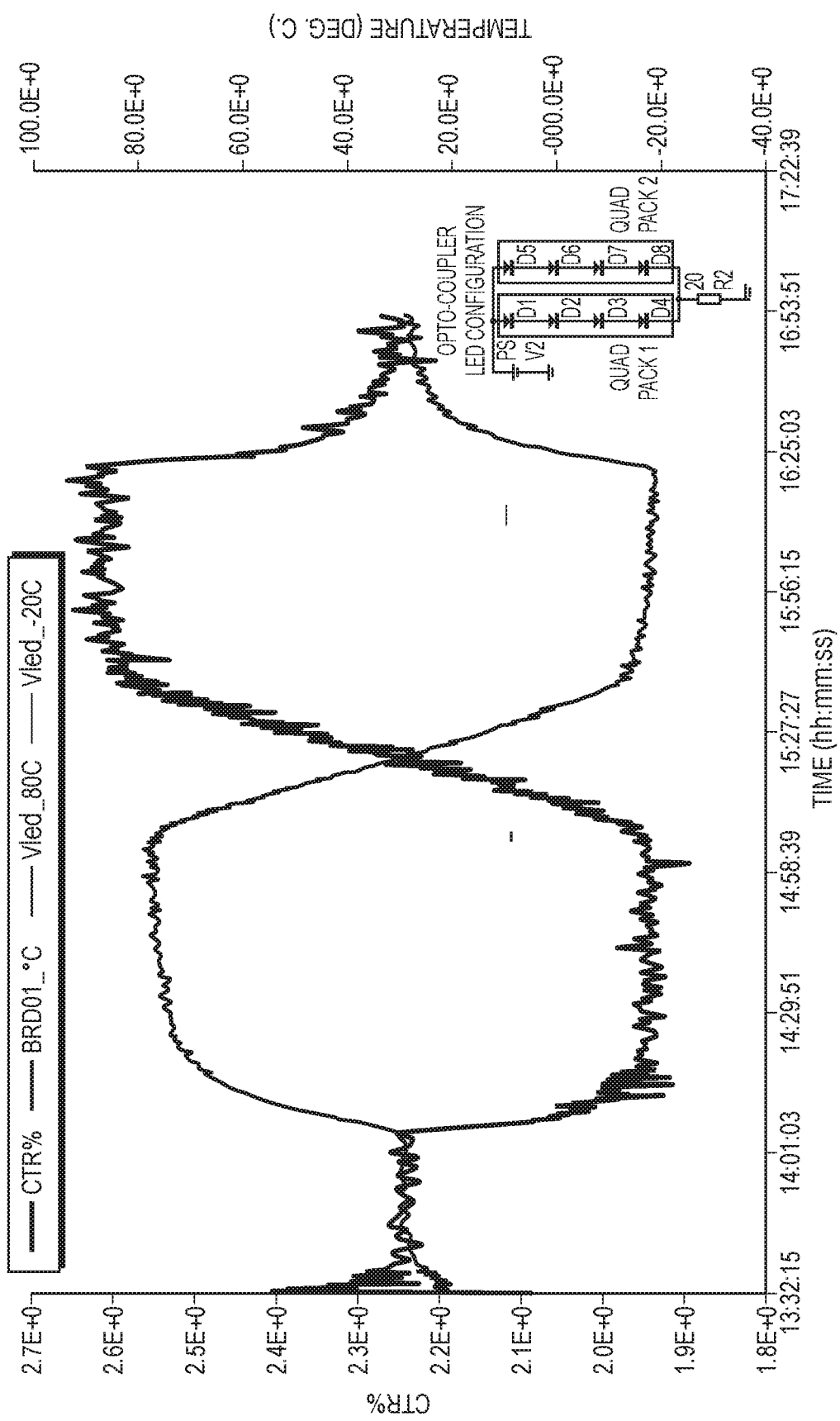
FIG. 9D is a graph illustrating CTR and temperature as a function of time for the opto-coupler 300 illustrated in FIGS. 3A-3B.

FIG. 9D is a graph illustrating CTR and temperature as a function of time for the opto-coupler 300 illustrated in FIGS. 3A-3B. In particular, CTR 974 and temperature 976 are shown for the same dual quad pack opto-coupler LED configuration whose performance is illustrated in FIGS. 9A-9C.

Figure 9E:
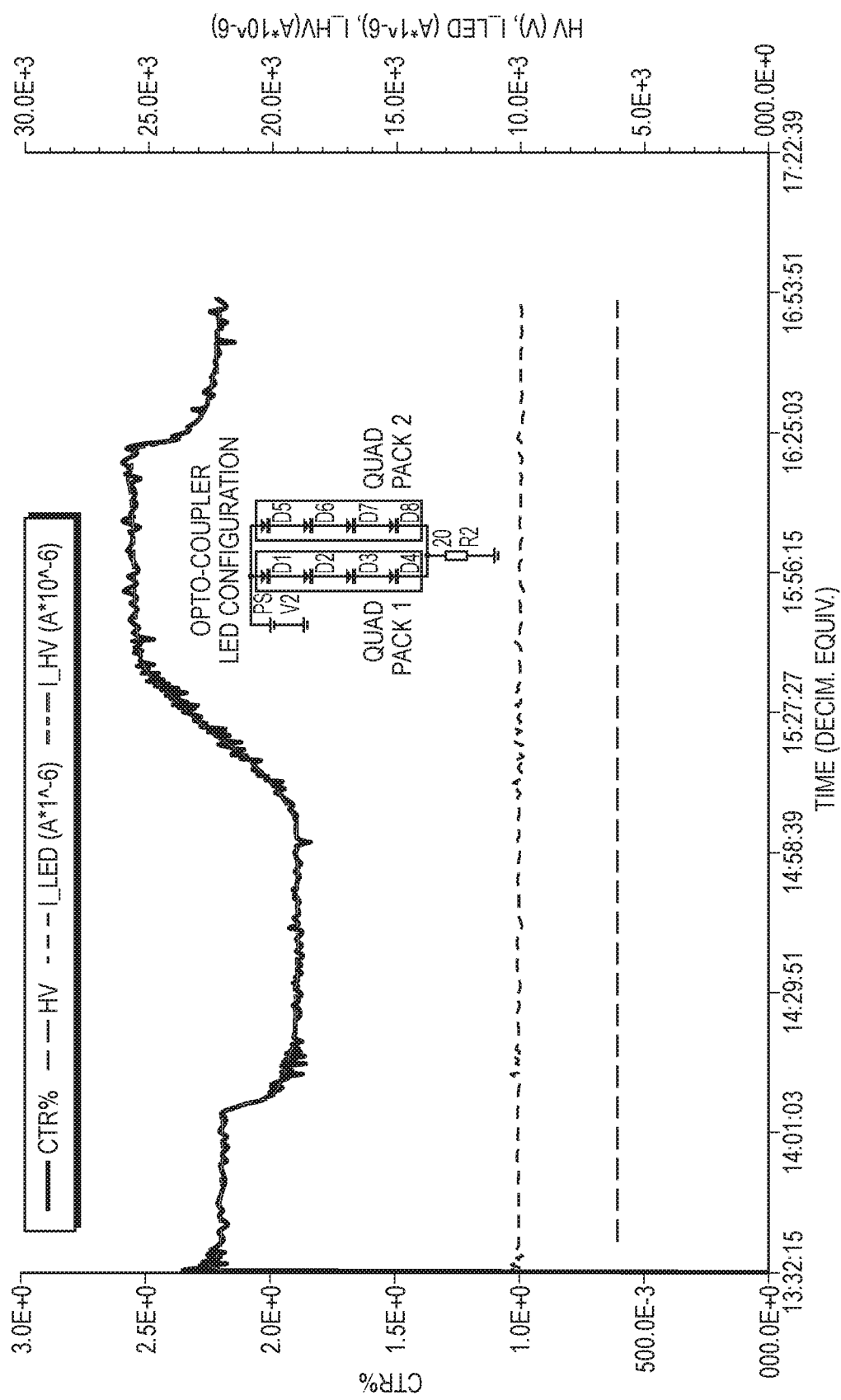
FIG. 9E is a graph illustrating CTR as a function of time (in decimal equivalent values) for the opto-coupler illustrated in FIGS. 3A-3D.

FIG. 9E is a graph illustrating CTR, high-voltage, LED current I_LED, and high-voltage current I_HV through the high-voltage diode as a function of time (in decimal equivalent values) for the opto-coupler 300 illustrated in FIGS. 3A-3D and LED configuration illustrated in FIGS. 9A-9D.

FIG. 10 is a flow diagram illustrating a procedure 1000 for manufacturing an opto-coupler. At 1038, at least one light-emitting diode (LED) is mounted within a housing config- ured to accommodate a high-voltage (HV) input conductor to protrude through an input end wall of the housing and to accommodate an HV output conductor to protrude through an output end wall of the housing. The LED is configured to activate an HV diode situated within the housing to pass electrical current from the HV input conductor to the HV output conductor by emitting light toward an active portion of the HV diode.

At 1039, at least one end cap is press-fitted to provide a press-fit seal either between the HV input conductor and the input end wall or between the HV output conductor and the output end wall. The at least one press-fit end cap is configured to protect the at least one LED from damage by shaping an electric field between the high-voltage HV input or output conductor and the LED.

In other embodiments, procedures for manufacturing an opto-coupler may further include preprocessing a lens of the LED (or lenses of multiple LEDs), to have a substantially flat lens surface configured to be situated in a path of the light emitted from the LED toward the active portion of the HV diode. The flattened lens 114 of FIGS. 1A and 8A is an example, the preprocessing can including flattening the lens surface as illustrated in FIGS. 8A-1 to 8A-2. When mounted to an opto-coupler housing as illustrated in FIG. 1A, for example, the substantially flat lens surface 114 is situated between the light-emitting portion of the LED 112 and the HV diode, directly in the path of light emitted from the LED toward the HV diode.

The procedure in FIG. 10 may be advantageously used to manufacture any of the embodiment opto-couplers described herein, including those described in connection with FIGS. 1A-1B, 3A-3B, 5A-5B, 6A-6D, 7A-7C, and 8A-1-8E-6.

Figure 11:
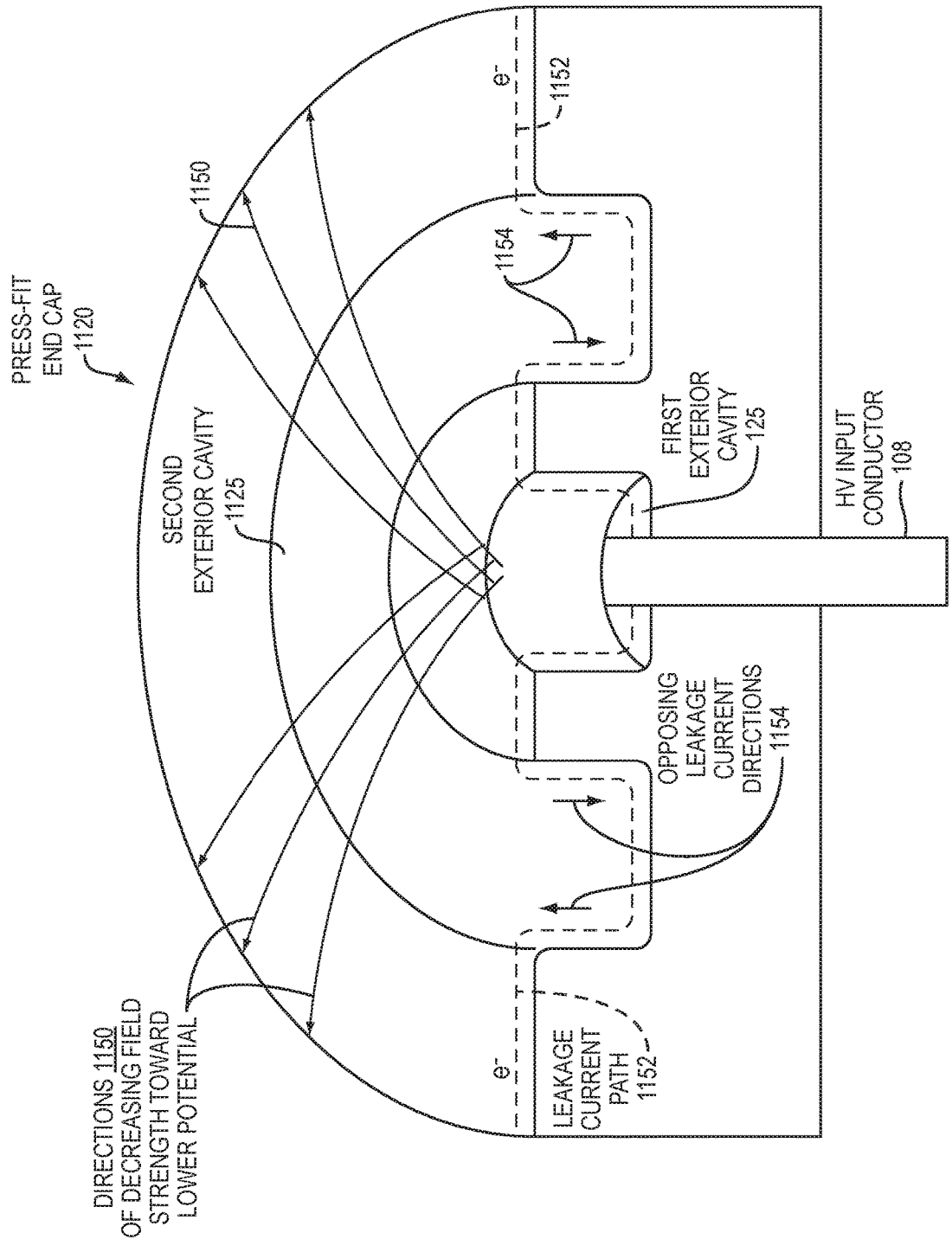
FIG. 11 is a cross-sectional diagram of an alternative press-fit end that includes multiple cavities on a side exterior to an opto-coupler housing.

FIG. 11 is a cross sectional view illustration of an alternative press-fit end 1120 that includes more than one and exterior cavity. The view in FIG. 11 illustrates the HV input conductor 108 inserted through the exterior cavity 125 of the end, as illustrated in FIGS. 1A-1B. However, unlike the end caps illustrated in FIGS. 1A-1B, the press-fit end 1120 in FIG. 11 includes a second exterior cavity 1125. The exterior cavity 1125 forms a base or conference around the first exterior cavity 125 and the conductor 108. The second exterior cavity 1125 may be molded or machined into the end 1120. The second exterior cavity 1125 assists in further protecting and opto-coupler, such as the opto-coupler 100 in FIG. 1A, from damage in two ways. First, the second exterior cavity 1125 further decreases electric field strength at locations surrounding the HV input conductor 108, such as at a circuit board on which an opto-coupler housing (not shown) having the press-fit end 1120 is mounted. Second, the second exterior cavity 1125, like the first exterior cavity 125, further increases path lengths for any leakage current from the conductor to ground, for example. Example leakage current paths 1152 are illustrated in FIG. 11, originating at the conductor 108 and following material interfaces toward locations of lower electric potential.

As also illustrated in FIG. 11, the second exterior cavity 1125 provides opposing leakage current directions 1154 for any leakage current traveling along material interfaces (e.g., between the press-fit end 1120 or features pair of and an opto-coupler housing such as the housing 102 with the input end wall 104 illustrated in FIG. 1A. The opposing leakage current directions 1154 have a tendency to cause cancellation of electric fields present. As will be understood, additional cavities beyond the first and second exterior cavities may also be provided in other embodiments for further increase in potential leakage current patents and further decrease in electric fields.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. An opto-coupler comprising:
   a housing having an input end wall and an output end wall, the input end wall configured to accommodate a high-voltage (HV) input conductor to protrude therethrough, and the output end wall configured to accommodate an HV output conductor to protrude therethrough;
   at least one light-emitting diode (LED) mounted to the housing, the LED configured to activate an HV diode situated within the housing to pass electrical current from the HV input conductor to the HV output conductor by emitting light toward an active portion of the HV diode; and
   at least one press-fit end cap configured to provide a press-fit seal either between the HV input conductor and the input end wall or between the HV output conductor and the output end wall,
   wherein the at least one press-fit end cap is configured to protect the at least one LED from damage by shaping an electric field between the HV input or output conductor and the LED.

2. The opto-coupler of claim 1, wherein the at least one press-fit end cap is a first press-fit end cap configured to provide a press-fit seal between the HV input conductor and the input end wall, the opto-coupler further including a second press-fit end cap configured to provide a press-fit seal between the HV output conductor and the output end wall.

3. The opto-coupler of claim 1, wherein the at least one press-fit end cap either defines a cavity around the HV input conductor at a side of the input end wall that is interior or exterior to the housing, or defines a cavity around the HV output conductor that is interior or exterior to the housing.

4. The opto-coupler of claim 1, wherein the at least one press-fit end cap is further configured to reduce exposure of an optically inactive region of the HV diode to light emitted by the at least one LED.

5. The opto-coupler of claim 1, wherein the at least one press-fit end cap is configured to enable the HV input conductor to be operated continuously at up to 8 kV relative to the LED without damaging the LED.

6. The opto-coupler of claim 1, wherein the at least one press-fit end cap is configured to enable the HV input conductor to be operated continuously at up to 15 kV relative to the LED without damaging the LED.

7. The opto-coupler of claim 1, wherein the housing, the at least one press-fit end cap, or both are formed of Gigahertz OPTIK® ODM98 sintered Teflon, polyether ether ketone (PEEK), or Ultem™ 1000 material.

8. The opto-coupler of claim 1, wherein the housing includes a top or bottom side that is substantially square in shape.

9. The opto-coupler of claim 1, wherein the housing has circuit board layout footprint dimensions of about 13 mm×15 mm.

10. The opto-coupler of claim 1, wherein the at least one LED and the at least one press-fit end cap are configured to enable the opto-coupler to operate with a current transfer ratio (CTR) between about 0.2 and about 4.0.

11. The opto-coupler of claim 10, wherein the at least one LED and the at least one press-fit end cap are further configured to enable the opto-coupler to operate with a CTR between about 0.2 and about 3.0.

12. The opto-coupler of claim 11, wherein the at least one LED and the at least one press-fit end cap are further configured to enable the opto-coupler to operate with a CTR between about 1.0 and about 3.0.

13. The opto-coupler of claim 1, wherein the at least one LED mounted to the housing includes two to four LEDs, four to eight LEDs, or eight to 64 LEDs mounted to the housing.

14. The opto-coupler of claim 13, wherein the LEDs are configured to provide operational redundancy in case of a failure of one or more of the LEDs.

15. The opto-coupler of claim 1, wherein the at least one LED includes a substantially flat lens configured to be situated in a path of the light emitted from the LED toward the active portion of the HV diode.

16. The opto-coupler of claim 1, wherein the at least one LED includes two or more LEDs configured to be driven electrically in parallel with mirrored current.

17. The opto-coupler of claim 1, wherein the at least one LED is further mounted to form a gap in a range of about 0.2 mm to about 0.5 mm between a lens of the at least one LED and the active portion of the HV diode.

18. A method of manufacturing an opto-coupler, the method comprising:
    mounting at least one light-emitting diode (LED) within a housing configured to accommodate a high-voltage (HV) input conductor to protrude through an input end wall of the housing and to accommodate an HV output conductor to protrude through an output end wall of the housing, the LED configured to activate an HV diode situated within the housing to pass electrical current from the HV input conductor to the HV output conductor by emitting light toward an active portion of the HV diode; and
    press-fitting at least one end cap to provide a press-fit seal either between the HV input conductor and the input end wall or between the HV output conductor and the output end wall, the at least one press-fit end cap configured to protect the at least one LED from damage by shaping an electric field between the HV input or output conductor and the LED.

19. The method of claim 18, further comprising preprocessing a lens of the at least one LED to have a substantially flat lens surface configured to be situated in a path of the light emitted from the LED toward the active portion of the HV diode.

* * * * *